(12) United States Patent
Tsutsui et al.

(10) Patent No.: US 7,715,812 B2
(45) Date of Patent: May 11, 2010

(54) RF POWER AMPLIFIER

(75) Inventors: Takayuki Tsutsui, Tokyo (JP); Yasutaka Nihongi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 474 days.

(21) Appl. No.: 11/776,851

(22) Filed: Jul. 12, 2007

(65) Prior Publication Data

US 2008/0024225 A1 Jan. 31, 2008

(30) Foreign Application Priority Data

Jul. 14, 2006 (JP) .............................. 2006-193838

(51) Int. Cl.
*H04B 1/16* (2006.01)
(52) U.S. Cl. .................. 455/127.4; 455/553.1
(58) Field of Classification Search .................. 455/78, 455/80, 550.1, 552.1, 553.1, 575.1, 91, 126.1, 455/127.1–127.4; 330/51, 278
See application file for complete search history.

(56) References Cited

U.S. PATENT DOCUMENTS

| 6,433,639 | B1 | 8/2002 | Numanami et al. | |
|---|---|---|---|---|
| 7,444,123 | B2 * | 10/2008 | Yamawaki et al. | 455/127.2 |
| 2004/0162107 | A1 * | 8/2004 | Klemetti et al. | 455/553.1 |
| 2005/0054308 | A1 * | 3/2005 | Vayrynen et al. | 455/127.4 |
| 2007/0082622 | A1 * | 4/2007 | Leinonen et al. | 455/78 |

FOREIGN PATENT DOCUMENTS

JP 2001-168647 6/2001

OTHER PUBLICATIONS

"High-Efficiency, Multi-Mode, Multi-Band Terminal Power Amplifiers" by Earl McCune, IEEE Magazine, Mar. 2005.
"A Novel Power-Amplifier Module for Quad-Band Wireless Handset Applications" by Shuyun Zhang, et al, IEEE Transactions on Microwave Theory and Techniques, vol. 51, No. 11, Nov. 2003.
"High Efficiency, Wide Dynamic Range Variable Gain and Power Amplifier MMICs for Wide-Band CDMA Handsets" by Gary Hau, et al IEEE Microwave and Wireless Components Letters, vol. 11, No. 1, Jan. 2001.
"RF-MEMS Switches for Reconfigurable Integrated Circuits" by Elliot R. Brown, IEEE Transactions on Microwave Theory and Techniques, vol. 46, No. 11, Nov. 1998.

* cited by examiner

*Primary Examiner*—Thanh C Le
(74) *Attorney, Agent, or Firm*—Mattingly & Malur, P.C.

(57) ABSTRACT

Transmission in DCS1800, PCS1900, and WCDMA1900 is performed by a common second RE power amplifier. In DCS1800 and DCS1900, transmission power is set in a high transmission power mode at 33 dBm by a high-gain input amplifier to activate an internal voltage follower of a bias circuit, and in WCDMA1900, in a low transmission power mode at 28 to 29 dBm by a low-gain input amplifier to inactivate the voltage follower. Switching of the high and low transmission power modes and controlling the voltage follower are performed according to a mode signal. In an RF power amplifier module that transmits frequencies of GSM850, GSM900, DCS1800, PCS1900, and WCDMA1900, it is possible to reduce the number of power amplifiers and, for ramp-up and ramp-down of the GSM standard, to perform high-speed control of an input bias voltage and reduce noise of a transmission power of a wideband WCDMA.

26 Claims, 7 Drawing Sheets

RF POWER AMPLIFIER

CLAIM OF PRIORITY

The present application claims priority from Japanese application JP 2006-193838 filed on Jul. 14, 2006, the content of which is hereby incorporated by reference into this application.

FIELD OF THE INVENTION

The present invention relates to an RF power amplifier for RF transmission mounted on communication terminal equipment such as a cellular phone terminal that performs communication with a base station. More particularly, the present invention relates to a technique useful for generating, with one RF power amplifier, a transmission signal at a frequency of 1920 MHz to 1980 MHz of the WCDMA system (hereinafter referred to as WCDMA1900 in this specification), a transmission signal at a frequency of 1850 MHz to 1910 MHz of the PCS system, and a transmission signal at a frequency of 1710 MHz to 1785 MHz of the DCS system.

BACKGROUND OF THE INVENTION

An ability of communication terminal equipment such as a cellular phone terminal for performing communication by radio anywhere in the world, i.e., ubiquitous coverage, is not realistic today but is now under development.

According to Earl McCune, "High-Efficiency, Multi-Mode, Multi-Band Terminal Power Amplifiers", IEEE microwave magazine, March 2005, PP. 44 to 55, these mobile systems include cellulars of GSM (Global System for Mobile Communication), GPRS (General Packet Radio Service), EDGE (Enhanced Data for GSM Evolution; Enhanced Data for GPRS), and WCDMA (Wideband Code Division Multiple Access), networks such as IEEE 803.11-b, -a, -g, and the like, and personal area networks such as Bluetooth and ZigBee. Characteristics of these systems cover a wide range of combinations of signals of a fixed envelope and an envelope change, multiplexes of time division and code division, and a transmission power ranging from high (several watts) to low (microwatts). As a result, there are increasing demands for RF power amplifiers applicable to a multimode.

On the other hand, in Shuyun Zhang et al, "A Novel Power-Amplifier Module for Quad-Band Wireless Handset Applications", IEEE TRANSACTIONS ON MICROWAVE THEORY AND TECHNIQUES, VOL. 52, No. 11, NOVEMBER 2003, PP. 2203 TO 2210, an RF power amplifier module that transmits a quad-band including frequency bands of GSM850, GSM900, DCS1800, and PCS1900 is described. DCS is the abbreviation of Digital Cellular System and PCS is the abbreviation of Personal Communication System. This RF power amplifier module includes a first power amplifier that amplifies a first RF transmission input signal having a first frequency band of GSM850 and GSM900 and a second power amplifier that amplifies a second RF transmission input signal having a second frequency band of DCS1800 and PCS1900.

In the communication in GSM850, GSM900, DCS1800, and PCS1900, the TDMA system that is capable of setting each of plural time slots in any one of an idle state, an operation for reception from a base station, and an operation for transmission to the base station in a time division manner is adopted. TDMA is the abbreviation of Time-Division Multiple Access. As one type of the TDMA system, the GSM system is known in which only the phase modulation is used. A system for improving a communication data transfer rate compared with the GSM system is also known. As this improved system, an EDGE system in which the amplitude modulation is used together with the phase modulation also attracts attention recently.

The WCDMA system in which a communication data transfer rate is improved by using the amplitude modulation together with the phase modulation as in the EDGE system also attracts attention. In this WCDMA system, rather than the TDMA system, the frequency division CDMA system in which a frequency of 2110 MHz to 2170 MHz is used for an operation for reception from a base station and, on the other hand, a frequency of 1920 MHz to 1980 MHz is used for an operation for transmission to the base station is adopted. CDMA is the abbreviation of Code Division Multiple Access.

In Gary Hau et al, "High Efficiency, Wide Dynamic Range Variable Gain and Power Amplifier MMICs for Wide-Band CDMA Handsets", IEEE MICROWAVE AND WIRELESS COMPONENTS LETTERS, VOL. 11, No. 1, JANUARY 2001, PP. 13 to 15, since a wide control range and high linearity are required in power control of an RF power amplifier of the WCDMA system, a variable gain amplifier formed by a variable attenuator is connected to an input of the RF power amplifier.

In JP-A-2001-168647, in order to cause an RF power amplifier to cope with a maximum power of 36 dBm of GSM (a nonlinear operation) and a maximum power of 29 dBm of EDGE (a linear operation), a gain control voltage is applied to a first gain close to a drain of a dual-gate field effect transistor and a bias voltage, which is obtained by dividing the gain control voltage with a voltage divider controlled by a mode switch, and an RF input signal are applied to a second gate close to a source. In a mode of GSM of the nonlinear operation, the mode switch is controlled to be on and a shallow bias voltage generated by the divided bias voltage is applied to the second gate. In a mode of EDGE of the nonlinear operation, the mode switch is controlled to be off and a deep bias voltage generated by the gain control voltage not divided is applied to the second gate. U.S. Pat. No. 6,443,639 corresponds to this patent document.

In Elliot R. Brown, "RF-MEMS Switches for Reconfigurable Integrated Circuits", IEEE TRANSACTIONS ON MICROWAVE THEORY AND TECHNIQUES, VOL. 46, NO. 11, NOVEMBER 1998, PP. 1868 to 1880 (hereinafter referred to as Non-Patent Document 4), an RF-MEMS switch based on MEMS (Micro Electro-Mechanical System) is introduced. It is reported that this switch shows an excellent high-frequency characteristic and is designed and manufactured by a technique similar to VLSI.

SUMMARY OF THE INVENTION

Prior to the present invention, the inventors were engaged in the development of an RF power amplifier module that transmits five frequency bands of GSM850, GSM900, DCS1800, PCS1900, and WCDMA1900.

In the RF power amplifier module developed prior to the present invention, a first RF power amplifier is used for GSM850 and GSM900 for outputting a maximum power of 35 dBm, a second RF power amplifier is used for DCS1800 and PCS1900 for outputting a maximum power of 33 dBm, and a third RF power amplifier is used for WCDMA1900 for outputting a maximum power of 28 to 29 dBm. A transmission frequency of GSM850 is 824 MHz to 849 MHz and a transmission frequency of GSM900 is 880 MHz to 915 MHz. The first RF power amplifier covers a frequency band of 0.8 GHz to 1.0 GHz. A transmission frequency of DSC1800 is 1710 MHz to 1785 MHz, a transmission frequency of PCS1900 is 1850 MHz to 1910 MHz, and a transmission frequency of WCDMA1900 is 1920 MHz to 1980 MHz. It may be considered that the second RF power amplifier can easily cover a frequency band of 1.7 GHz to 2.0 GHz of these three systems. However, for DCS1800 and PCS1900, the RF power amplifier needs to output a maximum power of 33 dBm. For WCDMA1900, the RF power amplifier needs to output a maximum power of 28 to 29 dBm. Because of a difference among the maximum powers of DCS1800, PCS1900, and WCDMA1900, the second RF power amplifier is used for DCS1800 and PCS1900 for outputting the maximum power of 33 dBm and the third RF power amplifier is used for WCDMA1900 for outputting the maximum power of 28 to 29 dBm.

FIG. 1 is a diagram showing a system configuration of a cellular phone terminal mounted with the RF power amplifier module developed prior to the present invention that covers the five frequency bands.

As shown in the figure, an audio signal of a microphone MIC of a cellular phone is processed by a baseband signal processing unit (BB_SPU) such as a baseband LSI (BB_LSI) and a baseband signal for transmission is supplied to a transmission signal processing unit (Tx_SPU) of an RF integrated circuit RF_IC. The RF integrated circuit RF_IC performs a reception operation and a transmission operation in a reception slot and a transmission slot according to the TDMA system of time division in GSM850, GSM900, DCS1800, and PCS1900. In WCDMA1900, the RF integrated circuit RF_IC performs parallel operations of a normal transmission operation at a transmission frequency of 1920 MHz to 1980 MHz and a normal reception operation at a reception frequency of 2110 MHz to 2170 MHz by the CDMA system of frequency division.

A reception operation of the cellular phone is performed as described below.

An RF reception signal at a reception frequency of 869 MHz to 894 MHz of GSM850 and an RF reception signal at a reception frequency of 925 MHz to 960 MHz of GSM 900 received by an antenna ANT of a cellular phone via a switch SW1 and a first surface acoustic wave SAW1, an RF reception signal at a reception frequency of 1805 MHz to 1880 MHz of DCS1800 and an RF reception signal at a reception frequency of 1930 MHz to 1990 MHz of PSC1900 received by the antenna ANT of the cellular phone via a switch SW2 and a second surface acoustic wave SAW2, and an RF reception signal at a reception frequency of 2110 MHz to 2170 MHz of WCDMA1900 received by the antenna ANT of the cellular phone via a splitter SPL are supplied to a reception signal processing unit (Rx_SPU) of the RF integrated circuit RF_IC. The reception signal processing unit (Rx_SPU) frequency down-converts the RF reception signals received into reception base signals and supplies the reception base signal to the baseband signal processing unit (BB_SPU) such as the baseband LSI (BB_LSI). Audio signals generated by signal processing of the baseband signal processing unit (BB_SPU) are supplied to a speaker SP of the cellular phone via a not-shown audio amplifier.

A transmission operation of the cellular phone is performed as described below.

The transmission signal processing unit (Tx_SPU) of the RF integrated circuit RF_IC frequency up-converts a baseband signal for transmission processed by the baseband signal processing unit (BB_SPU) into a transmission frequency 824 MHz to 849 MHz of GSM 850, a transmission frequency of 880 MHz to 915 MHz of GSM900, a transmission frequency of 1710 MHz to 1785 MHz of DCS1800, a transmission frequency of 1850 MHz to 1910 MHz of PCS1900, or a transmission frequency of 1920 MHz to 1980 MHz of WCDMA1900. The RF transmission signal frequency up-converted is amplified by a first RF power amplifier HPA1 for GSM850 and GSM900 for outputting a maximum power of 35 dBm, a second RF power amplifier HPA2 for DCS1800 and PCS1900 for outputting a maximum power of 33 dBm, or a third RF power amplifier HPA3 for WCDMA1900 for outputting a maximum power of 28 to 29 dBm and supplied to the antenna ANT of the cellular phone via the switch SW1 or SW2 of the antenna switch or the splitter SPL.

The first RF power amplifier HPA1 for GSM850 and GSM900 for outputting a maximum power of 35 dBm and the second RF power amplifier HPA2 for DCS1800 and PCS1900 for outputting a maximum power of 33 dBm are constituted as an RF power amplifier module RF_PAM1 that covers a quad-band. On the other hand, the third RF power amplifier HPA3 for WCDMA1900 for outputting a maximum power of 28 to 29 dBm is constituted as an RF power amplifier module RF_PAM2 that covers WCDMA.

However, in the RF power amplifier module developed prior to the present invention that covers the five frequency bands, since the three power amplifiers are used, component cost is high and an area occupied by a motherboard in the cellular phone terminal is large.

Therefore, it is an object of the present invention to reduce, in the RF power amplifier module that transmits at least the five RF transmission frequencies of GSM850, GSM900, DCS1800, PCS1900, and WCDMA1900, the number of power amplifiers in use and reduce the area occupied by the motherboard in the cellular phone terminal.

In GSM850, GSM900, DCS1800, and PCS1900, in transitioning from a transmission slot to a reception slot or a slot in an idle state in the TDMA system, it is necessary to ramp down a transmission power with a profile called a GSM mask. On the other hand, in transitioning from the reception slot to the slot in the idle state or the transmission slot, it is necessary to ramp up a transmission power with the profile. FIG. 8 is a graph showing ramp-down of a transmission power prescribed by the GSM standard. FIG. 9 is a graph of a transmission power prescribed by the GSM standard. In FIG. 8, a ramp-down characteristic L3 of the transmission power needs to be present between a broken line L1 and a broken line L2. In FIG. 9, a ramp-up characteristic L3 of the transmission power needs to be present between a broken line L1 and a broken line L2. When the ramp-down characteristic of the transmission power and the ramp-up characteristic of the transmission power do not satisfy the GSM standard, it is impossible to satisfy a frequency spectrum of an RF transmission signal of GMSK (Gaussian minimum-shift keying) adopted in the GSM. When the prescribed frequency spectrum of the RF transmission signal cannot be satisfied, it is impossible to sufficiently inhibit an undesired adjacent interference signal level.

FIG. 10 shows a frequency spectrum of an RF transmission signal of a cellular phone terminal prescribed by the standard of GMSK. A bold solid line PDS indicates a level prescribed by the standard of GMSK. An attenuation amount at ±200 KHz near a center frequency (an RF transmission frequency) is set to be equal to or lower than −30 dBm. An attenuation amount at ±400 KHz near the center frequency (the RF transmission frequency) is set to be equal to or lower than −60 dBm. A thin solid line indicates an example in which this standard is satisfied.

For ramp-up and ramp-down in the TDMA, in order to cause input bias voltage of an input side amplifier and an output side amplifier of a multi-stage amplifier of the second RF power amplifier to respond to a change in a gain control voltage at high speed, it is necessary to connect voltage followers having a high driving ability between a bias circuit and an input of the input side amplifier and between the bias circuit and an input of the output side amplifier. Whereas a bandwidth of the RF power amplifier is a narrow band of 0.2 MHz in GSM850, GSM900, DCS1800, and PCS1900, a bandwidth of the RF power amplifier needs to be an extremely wide band of 3.84 MHz in WCDMA1900. It has also been clarified through the examination of the inventors that, when the second RF power amplifier in the low transmission power mode amplifies an RF transmission signal of WCDMA1900, output noise of amplifiers in the voltage followers is amplified because of a wideband characteristic at 3.84 MHz of the second RF power amplifier in the low transmission power mode of WCDMA1900.

Therefore, it is another object of the present invention to attain, in executing switching of the high transmission power mode in GSM850, GSM900, DCS1800, and PCS1900 and the low transmission power mode in WCDMA1900 according to gain switching of the input side amplifier of the multistage amplifier of the second RF power amplifier, both highspeed control of an input bias voltage for ramp-up and ramp-down prescribed in the GSM standard and noise reduction of a transmission power of the wideband WCDMA1900.

The above-mentioned objects, other objects, and new characteristics of the present invention will become evident from the description of this specification and the accompanying drawings.

Aspects of the present invention disclosed in this application are briefly explained below.

According to a basic technical idea of the present invention for attaining the objects, in order to reduce the number of power amplifiers in use, a transmission frequency of 1710 MHz to 1785 MHz of DCS1800, a transmission frequency of 1850 MHz to 1910 MHz of PCS1900, and a transmission frequency of 1920 MHz to 1980 MHz of WCDMA1900 are transmitted by a common second RF power amplifier. Whereas a transmission power of the second RF power amplifier is set in a high transmission power mode at 33 dBm in DCS1800 and PCS1900, a transmission power of the second RF power amplifier is set in a low transmission power mode at 28 to 29 dBm in WCDMA1900. In the basic technical idea of the present invention, switching of the high transmission power mode and the low transmission power mode is executed according to gain switching of an input side amplifier of a multi-stage amplifier of the second RF power amplifier. If the switching of the high transmission power mode and the low transmission power mode is executed according to gain switching of an output side amplifier of the multi-stage amplifier of the second RF power amplifier, it is likely that an output of the input side amplifier of the multi-stage amplifier becomes excessively large with respect to an input dynamic range of the output side amplifier of the multi-stage amplifier and linearity that is important in transmission in the WCDMA system is deteriorated. The gain switching of the input side amplifier of the multi-stage amplifier of the second RF power amplifier according to the basis technical idea of the present invention is useful in terms of this linearity characteristic in the transmission in the WCDMA system.

An RF power amplifier (RF_PAM1) according to an aspect of the present invention includes a first power amplifier (HPA1) that amplifies a first RF transmission input signal (Pin_LB) of GSM850 and GSM900 and a second power amplifier (HPA2) that amplifies a second RF transmission input signal (Pin_HB) of DCS1800, PCS1900, and WCDMA1900.

The first power amplifier (HPA1) is constituted by a first multi-stage amplifier including at least a first input side amplifier (1st_Stg_LB) and a first output side amplifier (2nd_Stg_LB).

The second power amplifier (HPA2) is constituted by a second multi-stage amplifier including at least a second input side amplifier (1st_Stg_HB) and a second output side amplifier (2nd_Stg_HB).

When the second power amplifier (HPA2) amplifies the second RF transmission input signal (Pin_HB) of WCDMA1900, a gain of the second input side amplifier (1st_Stg_HB) of the second multi-stage amplifier is set to a low gain in response to a mode signal (MODE) of a predetermined signal (a high level).

When the second power amplifier (HPA2) amplifies the second RF transmission input signal (Pin_HB) of DCS1800 or PCS1900, the gain of the second input side amplifier (1st_Stg_HB) of the second multi-stage amplifier is set to a gain higher than the low gain in response to a change of the mode signal (MODE) to a signal (a low level) different from the predetermined signal (see FIGS. 1 and 2).

According to the aspect of the present invention, it is possible to attain the initial object according to operations described below.

A high maximum power of 33 dBm for DCS1800 and PCS1900 can be realized by the high gain of the second input side amplifier (1st_Stg_HB) of the second multi-stage amplifier (see characteristics L1 and L3 in FIG. 6). A low maximum power of 28 to 29 dBm for WCDMA1900 can be realized by the low gain of the second input side amplifier (1st_Stg_HB) of the second multi-stage amplifier (see characteristics L2 and L4 in FIG. 7).

In the RF power amplifier (RF_PAM1), preferably, first bias circuits (1st_BC_LB and 2nd_BC_LB) including first voltage followers (VF11 and VF12) are connected to the first multi-stage amplifier (1st_Stg_LB and 2nd_Stg_LB) of the first power amplifier (HPA1) and second bias circuits (1st_BC_HB and 2nd_BC_HB) including second voltage followers (VF21 and VF22) are connected to the second multi-stage amplifier (1st_Stg_HB and 2nd_Stg_HB) of the second power amplifier (HPA2).

For ramp-up and ramp-down in the TDMA system in the GSM transmission in GSM850 or GSM900 by the first power amplifier (HPA1), the first bias circuits (1st_BC_LB and 2nd_BC_LB) control a level of a bias voltage supplied to input electrodes of amplification elements (Q11 and Q12) of the first multi-stage amplifier (1st_Stg_LB and2nd_Stg_LB) of the first power amplifier (HPA1) by using the first voltage followers (VF11 and VF12) in response to a level of a gain control signal (Vramp).

In transmission in WCDMA1900 by the second power amplifier (HPA2), the second voltage followers (VF21 and VF22) of the second bias circuits (1st_BC_HB and 2nd_BC_HB) are controlled to be in an inactive state in response to the mode signal (MODE) of the predetermined signal (the high level). The second bias circuits (1st_BC_HB and 2nd_BC_HB) control, in response to a level of the gain control signal (Vramp), a level of a bias voltage supplied to input electrodes of amplification elements (Q21 and Q22) of the second multi-stage amplifier (1st_Stg_HB and 2nd_Stg_HB) of the second power amplifier (HPA2).

For ramp-up and ramp-down in the TDMA system in the GSM transmission of DCS1800 or PCS1900 by the second power amplifier (HPA2), the second voltage followers (VF21 and VF22) of the second bias circuits (1st_BC HB and 2nd_BC_HB) are controlled to be in an inactive state in response to the mode signal (MODE) of the different signal (the low level). The second bias circuits (1st_BC_HB and 2nd_BC_HB) control, in response to a level of the gain control signal (Vramp), a level of a bias voltage supplied to the input electrodes of the amplification elements (Q21 and Q22) of the second multi-stage amplifier (1st_Stg_HB and 2nd_Stg_HB) of the second power amplifier (HPA2) by using the second voltage followers (VF21 and VF22) controlled to be in the inactive state.

Therefore, according to the aspect of the present invention, when the second power amplifier (HPA2) amplifiers the second RF transmission input signal (Pin_HB) of WCDMA1900, the second voltage followers (VF21 and VF22) of the second bias circuits (1st_BC_HB and 2nd_BC_HB) of the second power amplifier (HPA2) are controlled to be in an inactive state. Thus, output noise of the second voltage followers (VF21 and VF22) is not amplified according to a wideband characteristic of the second RF power amplifier (HPA2) and it is possible to improve a noise characteristic (see FIG. 3).

In the RF power amplifier (RF_PAM1), preferably, the first power amplifier (HPA1) further includes the first input side bias circuit (1st_BC_LB) and the first input side voltage follower (VF11) for the first input side amplifier (1st_Stg_LB) of the first multi-stage amplifier. The first input side bias circuit (1st_BC_LB) generates a first input side bias voltage that changes in response to a level of a gain control signal (Vapc) for ramp-up and ramp-down in the TDMA system in the GSM communication. The first input side bias voltage generated by the first input side bias circuit (1st_BC_LB) is supplied to the input electrode of the first input side amplification element (Q11) of the first input side amplifier (1st_Stg_LB) of the first multi-stage amplifier of the first power amplifier (HPA1) via the first input side voltage follower (VF11). The second power amplifier (HPA2) further includes the second input side bias circuit (1st_BC_HB) and the second input side voltage follower (VF21) for the second input side amplifier (1st_Stg_HB) of the second multi-stage amplifier. The second input side bias circuit (1st_BC_HB) generates a second input side bias voltage that changes in response to a level of the gain control signal (Vapc) for ramp-up and ramp-down in the TDMA system in the GSM communication. The second input side bias voltage generated by the second input side bias circuit (1st_BC_HB) is supplied to the input electrode of the second input side amplification element (Q21) of the second input side amplifier (1st_Stg_HB) of the second multi-stage amplifier of the second power amplifier (HPA2) via the second input side voltage follower (VF21). When the second power amplifier (HPA2) amplifies the second RF transmission input signal (Pin_HB) of WCDMA1900, the second input side voltage follower (VF21) of the second power amplifier (HPA2) is controlled to be in an inactive state in response to the mode signal (MODE) of the predetermined signal (the high level). The second input side bias voltage generated by the second input side bias circuit (1st_BC_HB) is supplied to the input electrode of the second input side amplification element (Q21) bypassing the second input side voltage follower (VF21) controlled to be in the inactive state (see FIG. 3).

Therefore, according to the aspect of the present invention, when the second power amplifier (HPA2) amplifies the second RF transmission input signal (Pin_HB) of WCDMA1900, the second input side voltage follower (VF21) of the second power amplifier (HPA2) is controlled to be in an inactive state. Thus, output noise of the second input side voltage follower (VF21) is not amplified according to a wideband characteristic of the second RF power amplifier (HPA2) and it is possible to improve a noise characteristic.

In the RF power amplifier (RF_PAM1), preferably, the first power amplifier (HPA1) further includes the first output side bias circuit (2nd_BC_LB) and the first output side voltage follower (VF12) for the first output side amplifier (2nd_Stg_LB) of the first multi-stage amplifier. The first output side bias circuit (2nd_BC_LB) generates a first output side bias voltage that changes in response to a level of the gain control signal (Vapc) for ramp-up and ramp-down in the TDMA system in the GSM communication. The first output side bias voltage generated by the first output side bias circuit (2nd_BC_LB) is supplied to the input electrode of the first output side amplification element (Q12) of the first output side amplifier (2nd_Stg_LB) of the first multi-stage amplifier of the first power amplifier (HPA1) via the first output side voltage follower (VF12). The second power amplifier (HPA2) further includes the second output side bias circuit (2nd_BC_HB) and the second output side voltage follower (VF22) for the second output side amplifier (2nd_Stg_HB) of the second multi-stage amplifier. The second output side bias circuit (2nd_BC_HB) generates a second output side bias voltage that changes in response to a level of the gain control signal (Vapc) for ramp-up and ramp-down in the TDMA system in the GSM communication. The second output side bias voltage generated by the second output side bias circuit (2nd_BC_HB) is supplied to the input electrode of the second output side amplification element (Q22) of the second output side amplifier (2nd_Stg_HB) of the second multi-stage amplifier of the second power amplifier (HPA2) via the second output side voltage follower (VF22). When the second power amplifier (HPA2) amplifies the second RF transmission input signal (Pin_HB) of WCDMA1900, the second output side voltage follower (VF22) of the second power amplifier (HPA2) is controlled to be in an inactive state in response to the mode signal (MODE) of the predetermined signal (the high level). The second output side bias voltage generated by the second output side bias circuit (2nd_BC_HB) is supplied to the input electrode of the second output side amplification element (Q22) bypassing the second output side voltage follower (VF22) controlled to be in the inactive state (see FIG. 3).

Therefore, according to the aspect of the present invention, when the second power amplifier (HPA2) amplifies the second RF transmission input signal (Pin_HB) of WCDMA1900, the second output side voltage follower (VF22) of the second power amplifier (HPA2) is controlled to be in an inactive state. Thus, output noise of the second output side voltage follower (VF22) is not amplified by a wideband characteristic of the second RF power amplifier (HPA2) and it is possible to improve a noise characteristic.

In the RF power amplifier (Rf_PAM1), preferably, a frequency of the second RF transmission input signal (Pin_HB) is set to be about twice as high as a frequency of the first RF transmission input signal (Pin_LB). The first power amplifier (HPA1) includes harmonic trap circuits (HTCs; L101 and C101) that bypass the two-fold harmonic of the first RF transmission input signal (Pin_LB) to a ground potential point (see FIG. 3).

In the RF power amplifier (RF_PAM1), preferably, the second input side amplifier (1st_Stg_HB) of the second multi-stage amplifier of the second power amplifier (HPA2) is constituted by a negative feedback amplifier. A negative feedback amount of the second input side amplifier (1st_Stg_HB) constituted by the negative feedback amplifier at the time when the mode signal (MODE) is the predetermined signal (the high level) is set to be larger than a negative feedback amount of the second input side amplifier (1st_Stg_HB) constituted by the negative feedback amplifier at the time when the mode signal (MODE) is the different signal (the low level).

Therefore, according to the aspect of the invention, when the second power amplifier (HPA2) amplifies the second RF transmission input signal (Pin_HB) of WCDMA1900, the negative feedback amount of the second input side amplifier (1st_Stg_HB) constituted by the negative feedback amplifier is set large. Thus, it is possible to set the second input side amplifier (1st_Stg_HB) of the second power amplifier (HPA2) to have a low gain. Since the negative feedback amount is set large in this case, it is possible to obtain a characteristic of high linearity suitable for the RF transmission in the WCDMA system.

In the RF power amplifier (RF_PAM1), preferably, the second input side amplifier (1st_Stg_HB) of the second multi-stage amplifier of the second power amplifier (HPA2) includes negative feedback variable resistors (R23, R24, and SW20) connected between the output electrode and the input electrode of the second input side amplification element (Q21) When the mode signal (MODE) is the predetermined signal (the high level), resistances of the negative feedback variable resistors (R23, R24, and SW20) are controlled to be low resistances. When the mode signal (MODE) is the different signal (the low level), the resistances of the negative feedback variable resistors (R23, R24, and SW20) are controlled to be high resistances higher than the low resistances (see FIG. 3).

In the RF power amplifier (RF_PAM1), preferably, the second input side amplifier (1st_Stg_HB) of the second multi-stage amplifier of the second power amplifier (HPA2) further includes a control amplification element (Q21B) connected between the output electrode of the second input side amplification element (Q21A) and a load element (L21). A gain control voltage ($V_H$ or $V_L$) is applied to the input electrode of the control amplification element (Q21B). When the second power amplifier (HPA2) amplifies the second RF transmission input signal (Pin_HB) of the DCS1800 or PCS1900, the gain control voltage is set to a high level ($V_H$). When the second power amplifier (HPA2) amplifies the second RF transmission input signal (Pin_HB) of WCDMA1900, the gain control voltage is set to a low level ($V_L$) lower than the high level ($V_H$) (see FIG. 4).

Therefore, according to the aspect of the present invention, when the second power amplifier (HPA2) amplifies the second RF transmission input signal (Pin_HB) of WCDMA1900, an amplification factor of the control amplification element (Q21B) of the second input side amplifier (1st_Stg_HB) is lowered. Thus, it is possible to set the second input side amplifier (1st_Stg_HB) of the second power amplifier (HPA2) to have a low gain. In this case, the source-grounded or emitter-grounded second input side amplification element (Q21A) and the cascaded control amplification element (Q21B) operate as gate-grounded or base-grounded elements. Thus, it is possible to obtain a high frequency characteristic suitable for the RF transmission in the WCDMA system.

In the RF power amplifier (RF_PAM1), preferably, the first input side amplification element (Q11), the second input side amplification element (Q21), the first output side amplification element (Q12), and the second output side amplification element (Q22) of the first power amplifier (HPA1) and the second power amplifier (HPA2) are field effect transistors.

In the RF power amplifier (RF_PAM1), preferably, the field effect transistors are lateral double diffused MOSs (LD-MOSs).

In the RF power amplifier (RF_PAM1), preferably, the first input side amplification element (Q11), the second input side amplification element (Q21), the first output side amplification element (Q12), and the second output side amplification element (Q22) of the first power amplifier (HPA1) and the second power amplifier (HPA2) are bipolar transistors.

In the RF power amplifier (RF_PAM1), preferably, the bipolar transistors are heterojunction bipolar transistors.

In the RF power amplifier (RF_PAM1), preferably, the first power amplifier (HPA1), the second power amplifier (HPA2), and a power detector (DET) that detects transmission power levels of the first power amplifier (HPA1) and the second power amplifier (HPA2) are mounted on a package of an RF power module (see FIG. 12).

An RF power amplifier (RF_PAM1) according to another aspect of the present invention includes a first power amplifier (HPA1) that amplifies a first RF transmission input signal of the TDMA system having a first frequency band of about 0.8 GHz to 1.0 GHz and a second power amplifier (HPA2) that amplifies a second RF transmission input signal of the TDMA system having a second frequency band of about 1.7 GHz to 2.0 GHz and a third RF transmission input signal of the WCDMA system having a third frequency band of about 1.7 GHz to 2.0 GHz.

The first power amplifier (HPA1) is constituted by a first multi-stage amplifier including at least a first input side amplifier (1st_Stg_LB) and a first output side amplifier (2nd_Stg_LB).

The second power amplifier (HPA2) is constituted by a second multi-stage amplifier including at least a second input side amplifier (1st_Stg_HB) and a second output side amplifier (2nd_Stg_HB).

When the second power amplifier (HPA2) amplifies the third RF transmission input signal of the WCDMA system, a gain of the second input side amplifier (1st_Stg_HB) of the second multi-stage amplifier is set to a low gain in response to a mode signal (MODE) of a predetermined signal (a high level).

When the second power amplifier (HPA2) amplifies the second RF transmission input signal of the TDMA system, the mode signal (MODE) is changed to a signal (a low level) different from the predetermined signal. Consequently, the gain of the second input side amplifier (1st_Stg_HB) of the second multi-stage amplifier is set to a high gain higher than the low gain (see FIGS. 1 and 2).

According to the aspect of the present invention, it is possible to attain the initial object according to operations described below.

A high maximum power of 33 dBm for the second RF transmission input signal of the TDMA system can be realized by the high gain of the input side amplifier (1st_Stg_HB) of the multi-stage amplifier (see characteristics L1 and L3 in FIG. 6). A low maximum power of 28 to 29 dBm for the third RF transmission input signal of the WCDMA system can be realized by the low gain of the input side amplifier (1st_Stg_HB) of the multi-stage amplifier (see characteristics L2 and L4 in FIG. 7).

Effects of the present invention are briefly explained below.

According to the present invention, it is possible to reduce, in the RF power amplifier module that transmits at least the five RF transmission frequencies of GSM850, GSM900, DCS1800, PCS1900, and WCDMA1900, the number of power amplifiers in use and reduce the area occupied by the motherboard in the cellular phone terminal.

According to the present invention, it is possible to attain, in executing switching of the high transmission power mode in GSM850, GSM900, DCS1800, and PCS1900 and the low transmission power mode in WCDMA1900 according to gain switching of the input side amplifier of the multi-stage amplifier of the second RF power amplifier, both high-speed control of an input bias voltage for ramp-up and ramp-down prescribed in the GSM standard and noise reduction of a transmission power of the wideband WCDMA1900.

DETAILED DESCRIPTION OF THE PREFERRED EMBODIMENTS

Structure of a Cellular Phone

Figure 2:
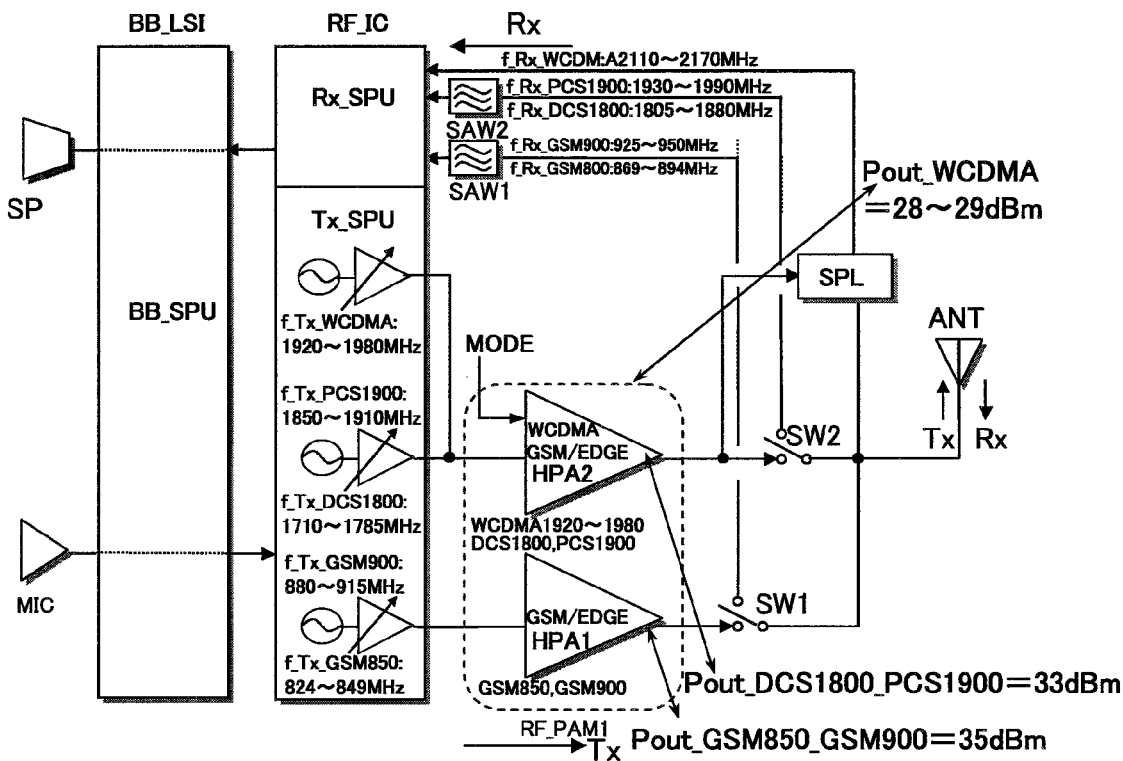
FIG. 2 is a diagram showing a system configuration of a cellular phone that is mounted with an RF power amplifier RF_PAM1 according to an embodiment of the present invention and performs communication with a base station.

FIG. 2 is a diagram showing a system configuration of a cellular phone that is mounted with an RF power amplifier RF_PAM1 according to an embodiment of the present invention and performs communication with a base station.

Figure 1:
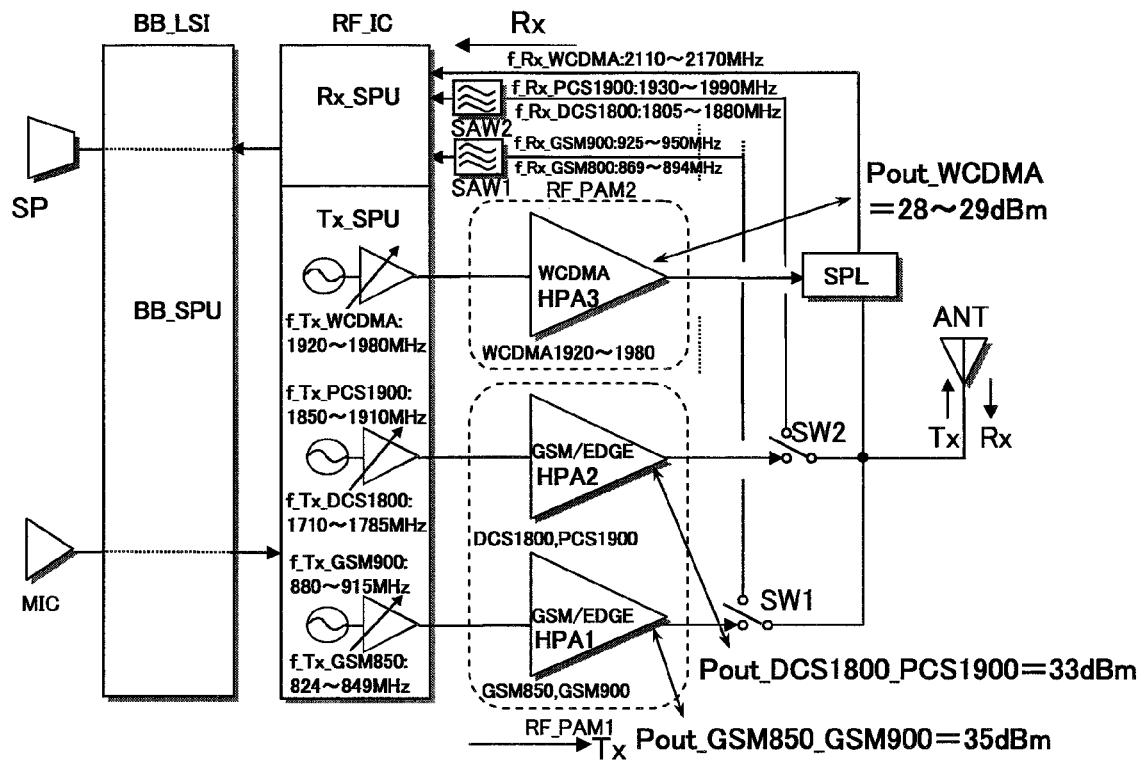
FIG. 1 is a diagram showing a system configuration of a cellular phone terminal mounted with an RF power amplifier module developed prior to the present invention that covers five frequency bands.

Compared with the system configuration of the cellular phone developed prior to the present invention shown in FIG. 1, in the system configuration of the cellular phone shown in FIG. 2, it is possible to cover five bands with one RF power module RF_PAM1 including only two RF power amplifiers; a first RF power amplifier HPA1 for GSM850 and GSM900 for outputting a maximum power of 35 dBm and a second RF power amplifier HPA2 for DCS1800 and PCS1900 for outputting a maximum power of 33 dBm and WCDMA1900 for outputting a maximum power of 28 to 29 dBm. Therefore, compared with FIG. 1, the number of RF power amplifiers is reduced from three to two and the number of RF power modules is reduced from two to one. Thus, it is possible to reduce component cost and an area occupied by a motherboard in the cellular phone terminal.

Structure of the RF Power Module

Figure 3:
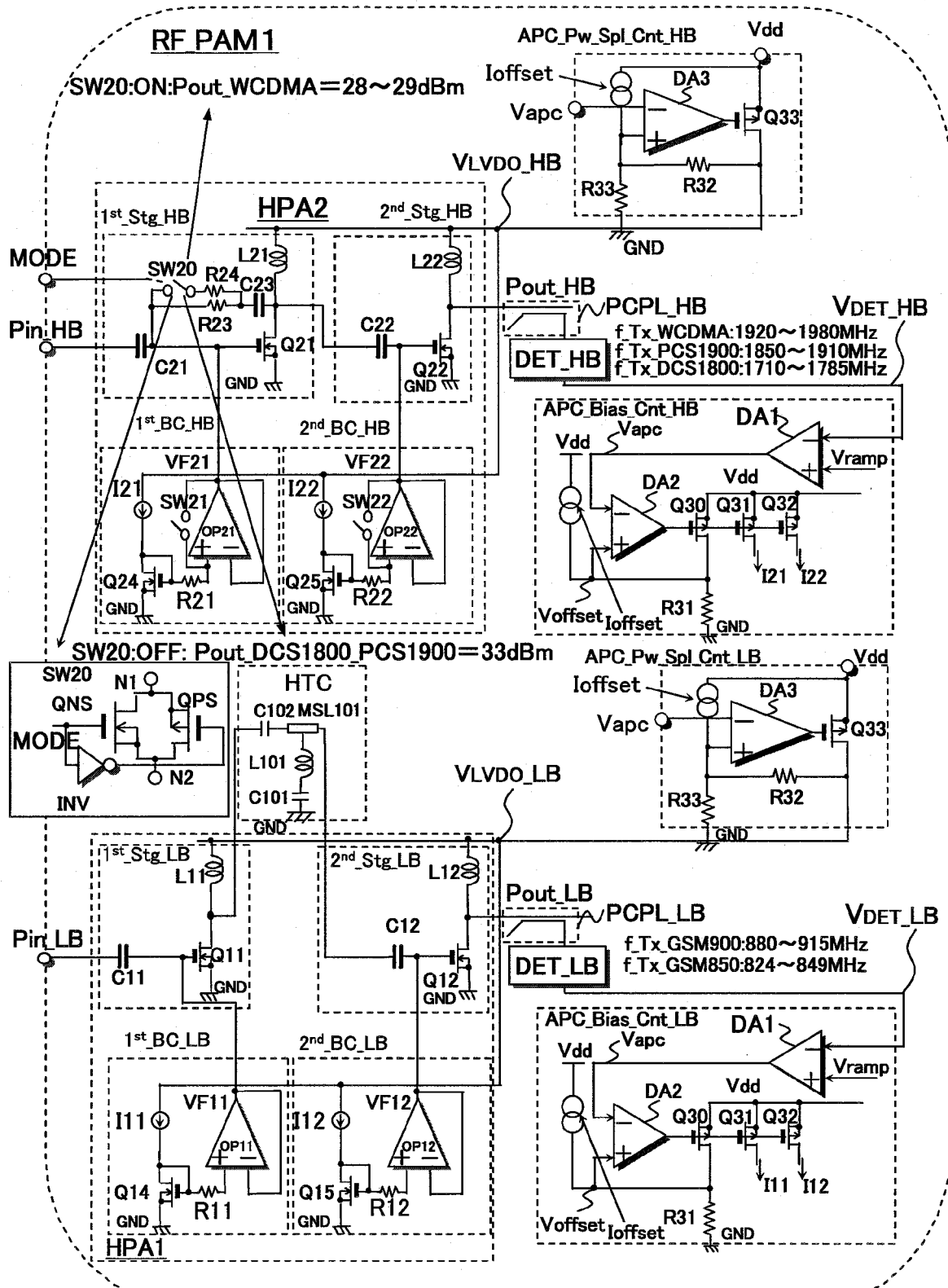
FIG. 3 is a circuit diagram showing an RF power amplifier according to the embodiment of the present invention.

FIG. 3 is a circuit diagram showing an RF power amplifier according to an embodiment of the present invention.

As shown in the figure, the RF power amplifier according to the embodiment is constituted as the RF power module RF_PAM1 built in one package.

A first RF transmission input signal Pin_LB having a first frequency band of about 0.8 GHz to 1.0 GHz of GSM850 and GSM900 and a second RF transmission input signal Pin_HB having a second frequency band of about 1.7 GHz to 2.0 GHz of DCS1800, PCS1900, and WCDMA1900 from an RF transmission/reception analog signal processing integrated circuit (hereinafter referred to as RF IC) mounted on communication terminal equipment such as a cellular phone are supplied to a first RF power amplifier HPA1 and a second RF power amplifier HPA2 of the RF power module RF_PAM1, respectively.

An RF transmission signal in a band of GSM850 and an RF transmission signal in a band of GSM900 are supplied to an input of the first RF power amplifier HPA1 as the first RF transmission input signal Pin_LB having the first frequency band. A frequency band of the RF transmission signal in the band of GSM850 is 824 MHz to 849 MHz and a frequency band of the RF transmission signal in the band of GSM900 is 880 MHz to 915 MHz.

An RF transmission signal in a band of DCS1800 and an RF transmission signal in a band of PCS1900 are supplied to an input of the second RF power amplifier HPA2 as the second RF transmission input signal Pin_HB having the second frequency band. An RF transmission signal in a band of WCDMA1900 may also be supplied to the input of the second RF power amplifier HPA2 as the second RF transmission input signal Pin_HB. A frequency band of the RF transmission signal in the band of DCS1800 is 1710 MHz to 1785 MHz, a frequency band of the RF transmission signal in the band of PCS1900 is 1850 MHz to 1910 MHz, and a frequency band of the RF transmission signal in the band of WCDMA1900 is 1920 MHz to 1980 MHz.

In the RF power amplifier RF_PAM1 shown in FIG. 3, basic structures of the first RF power amplifier HPA1 and the second RF power amplifier HPA2 are substantially identical.

In the first RF power amplifier HPA1, the first RF transmission input signal Pin_LB is amplified by an RF amplification element Q11 of an input side amplifier 1st_Stg_LB of a multi-stage amplifier via a coupling capacitor C11. The RF amplified signal of the input side amplifier 1st_Stg_LB is amplified by an RF amplification element Q12 of an output side amplifier 2nd_Stg_LB of the multi-stage amplifier via a harmonic trap circuit HTC and a coupling capacitor C12. A first RF transmission power signal Pout_LB is obtained from an output of the RF amplification element Q12. An operating voltage $V_{LVDO\_LB}$ is supplied from an APC operating voltage supply control circuit APC_Pw_Spl_Cnt_LB to an output electrode of the RF amplification element Q11 of the input side amplifier 1st_Stg_LB via an inductor L11 serving as a load element and to an output electrode of the RF amplification element Q12 of the output side amplifier 2nd_Stg_LB via an inductor L12 serving as a load element. A bias voltage formed by an input side bias circuit 1st_BC_LB is supplied to an input electrode of the RF amplification element Q11 of the input side amplifier 1st_Stg via an input side voltage follower VF11 constituted by an internal amplifier OP 11. An input bias current I11 of this input side bias circuit 1st_BC_LB is supplied from an output electrode of a constant current element Q31 of an APC bias control circuit APC_Bias_Cnt_LB.

A bias voltage formed by an output side bias circuit 2nd_BC_LB is supplied to an input electrode of the RF amplification element Q12 of the output side amplifier 2nd_Stg_LB via an output side voltage follower VF12 constituted by an internal amplifier OP12. An input bias current I12 of this output side bias circuit 2nd_BC_LB is supplied from an output electrode of a constant current element Q32 of the APC bias control circuit APC_Bias_Cnt_LB. Although the voltage followers VF11 and VF12 are constituted by the internal amplifiers OP11 and OP12, it is possible to replace the voltage followers VF11 and VF12 with source followers or emitter followers having a simple circuit configuration.

In the APC bias control circuit APC_Bias_Cnt_LB, a part of the first RF transmission power signal Pout_LB is detected by a power coupler PCPL_LB and a power detector DET_LB. A power detection output signal $V_{DET}$_LB of this detection is supplied to an inverting input terminal—of a first differential amplifier DA1. On the other hand, a ramp voltage Vramp is supplied to a non-inverting input terminal + of the first differential amplifier DA1. The ramp voltage Vramp is a signal supplied from a baseband signal processing unit such as a baseband LSI to an RF power amplifier via the RF IC. The ramp voltage Vramp is a transmission power indication signal that is proportional to a distance between a base station and a cellular phone or proportional to an AM modulation amplitude in the EDGE system. An APC (Automatic Power Control) control voltage Vapc of an output terminal of the first differential amplifier DA1 is supplied to an inverting input terminal—of the second differential amplifier DA2. On the other hand, an offset voltage Voffset is supplied to a non-inverting input terminal+of the second differential amplifier DA2. The offset voltage Voffset is generated when an offset current Voffset flows to a resistor R31. When the power detection output signal $V_{DET}$_LB is at a level lower than the ramp voltage Vramp, the APC control voltage Vapc is at a high level. When the APC control voltage Vapc is higher than a level of the offset voltage Voffset, an output voltage of the second differential amplifier DA2 is at a low level. Then, a drain voltage of a P-MOS Q30 and a voltage at the non-inverting input terminal+of the second differential amplifier DA2 increase following the level of the APC control voltage Vapc. Then, an electric current flowing to the P-MOS Q30 and the resistor R31 increases. An electric current I11 from a drain of a P-MOS Q31 and an electric current I12 from a drain of a P-MOS Q32 also increase. These electric currents I11 and I12 are a power supply source I11 of the input side bias circuit 1st_BC_LB and a power supply source I12 of the output side bias circuit 2nd_BC_LB, respectively. Therefore, when the power detection output signal $V_{DET}$_LB is at a level lower than the ramp voltage Vramp, a bias voltage at the input terminal of the RF amplification element Q11 of the input side amplifier 1st_Stg_LB and a bias voltage at the input terminal of the next stage RF amplification element Q12 of the output side amplifier 2nd_Stg_LB increase. As a result, all RF amplification gains of the input side amplifier 1st_Stg_LB and the output side amplifier 2nd_Stg_LB of the first RF power amplifier HPA1 increase.

In the APC power supply control circuit APC_Pw_Spl_Cnt_LB, an APC control voltage Vapc from the output terminal of the first differential amplifier DA1 of the APC bias control circuit APC_Bias_Cnt_LB is supplied to an inverting input terminal—of a third differential amplifier DA3. Negative feedback signals from a P-MOS Q33 and voltage dividing resistors R32 and R33 are supplied to a non-inverting input terminal+of the third differential amplifier DA3. When a power supply voltage Vdd from a battery of the cellular phone is supplied to a source of the P-MOS Q33, the APC power supply control circuit APC_Pw_Spl_Cnt_LB supplies an operating voltage $V_{LVDO}$_LB following a level of the APC control voltage Vapc to the first RF power amplifier HPA1. As a result, more effective APC control is performed according to APC input bias control and APC power supply voltage control. This APC drain power supply voltage control is a method for AM modulation that is effective when the first RF power amplifier HPA1 executes AM modulation in the EDGE system with a high communication transfer rate in communication of GSM850 and GSM900.

In the RF power amplifier RF_PAM1 in FIG. 3, the harmonic trap circuit HTC including an inductor L101 and a capacitor C101 is connected to a drain of a source-grounded N-MOS Q11 of the input side amplifier 1st_Stg_LB of the first RF power amplifier HPA1 for GSM850 and GSM900. A DC resonance frequency of the inductor L101 and the capacitor C101 of the harmonic trap circuit HTC is set to substantially resonate with a frequency (1700 MHz to 1800 MHz) of a harmonic twice as high as a frequency of an RF transmission input signal RFPin_LB of GSM850 and GSM900. As a result, the two-fold harmonic of the drain of the source-grounded N-MOS Q11 of the first RF power amplifier HPA1 is bypassed to a ground potential point via an extremely low DC resonance impedance of the inductor L101 and the capacitor C101 of the harmonic trap circuit HTC. The harmonic trap circuit HTC connected to the drain of the source-grounded N-MOS Q11 of the first RF power amplifier HPA1 prevents the two-fold harmonic of the frequency of the RF transmission signal RFPin_LB of GSM850 and GSM900 from becoming an interfering signal and affecting N-MOSs Q21 and Q22 of the second RF power amplifier HPA2 that amplifies an RF transmission input signal RFPin_HB of DCS1800 and PCS1900

In the second RF power amplifier HPA2, the second RF transmission input signal Pin_HB is amplified by an RF amplification element Q21 of an input side amplifier 1st_Stg_HB of a multi-stage amplifier via a coupling capacitor C21. The RF amplified signal of the input side amplifier 1st_Stg_HB is amplified by an RF amplification element Q22 of an output side amplifier 2nd_Stg_HB of the multi-stage amplifier via a coupling capacitor C22. A second RF transmission power signal Pout_HB is obtained from an output of the RF amplification element Q22 An operating voltage $V_{LVDO}$_HB is supplied from an APC operating voltage supply control circuit APC_Pw_Spl_Cnt_HB to an output electrode of the RF amplification element Q21 of the input side amplifier 1st_Stg_HB via an inductor L21 serving as a load element and to an output electrode of the RF amplification element Q22 of the output side amplifier 2nd_Stg_HB via an inductor L22 serving as a load element. A bias voltage formed by an input side bias circuit 1st_BC_HB is supplied to an input electrode of the RF amplification element Q21 of the input side amplifier 1st_Stg_HB via an input side voltage follower VF21 formed by an internal amplifier OP21. An input bias current I21 of this input side bias circuit 1st_BC_HB is supplied from an output electrode of a constant current element Q31 of an APC bias control circuit APC_Bias_Cnt_HB. A bias voltage formed by an output side bias circuit 2nd_BC_HB is supplied to an input electrode of the RF amplification element Q22 of the output side amplifier 2nd_Stg_HB via an output side voltage follower VF22 formed by an internal amplifier OP22. An input bias current I22 of this output side bias circuit 2nd_BC_HB is supplied from an output electrode of a constant current element Q32 of the APC bias control circuit APC_Bias_Cnt_HB.

In the APC bias control circuit APC_Bias_Cnt_HB, a part of the second RF transmission power signal Pout_HB is detected by a power coupler PCPL_HB and a power detector DET_HB. A power detection output signal $V_{DET\_}$HB of this detection is supplied to an inverting input terminal—of a first differential amplifier DA1. On the other hand, a ramp voltage Vramp is supplied to a non-inverting input terminal+of the first differential amplifier DA1. An APC control voltage Vapc of an output terminal of the first differential amplifier DA1 is supplied to an inverting input terminal—of the second differential amplifier DA2. On the other hand, an offset voltage Voffset is supplied to a non-inverting input terminal+of the second differential amplifier DA2. The offset voltage Voffset is generated when an offset current Ioffset flows to a resistor R31. When the power detection output signal $V_{DET\_}$HB is at a level lower than the ramp voltage Vramp, the APC control voltage Vapc is at a high level. When the APC control voltage Vapc is higher than a level of the offset voltage Voffset, an output voltage of the second differential amplifier DA2 is at a low level. Then, a drain voltage of a P-MOS Q30 and a voltage at the non-inverting input terminal+of the second differential amplifier DA2 increase following the level of the APC control voltage Vapc. Then, an electric current flowing to the P-MOS Q30 and the resistor R31 increases. An electric current I21 from a drain of a P-MOS Q31 and an electric current I22 from a drain of a P-MOS Q32 also increase. These electric currents I21 and I22 are a power supply source I21 of the input side bias circuit 1st_BC_HB and a power supply source I22 of the output side bias circuit 2nd_BC_HB, respectively. Therefore, when the power detection output signal $V_{DET\_}$HB is at a level lower than the ramp voltage Vramp, a bias voltage at the input terminal of the RF amplification element Q21 of the input side amplifier 1st_Stg_HB and a bias voltage at the input terminal of the next stage RF amplification element Q22 of the output side amplifier 2nd_Stg_HB increase. As a result, all RF amplification gains of the input side amplifier 1st_Stg_HB and the output side amplifier 2nd_Stg_HB of the second RF power amplifier HPA2 increase.

In the APC power supply control circuit APC_Pw_Spl_Cnt_HB, an APC control voltage Vapc from the output terminal of the first differential amplifier DA1 of the APC bias control circuit APC_Bias_Cnt_HB is supplied to an inverting input terminal—of a third differential amplifier DA3. Negative feedback signals from a P-MOS Q33 and voltage dividing resistors R32 and R33 are supplied to a non-inverting input terminal+of the third differential amplifier DA3. When a power supply voltage Vdd from a battery of the cellular phone is supplied to a source of the P-MOS Q33, the APC power supply control circuit APC_Pw_Spl_Cnt_HB supplies an operating voltage $V_{LVDO\_}$HB following a level of the APC control voltage Vapc to the second RF power amplifier HPA2. As a result, more effective APC control is performed according to APC input bias control and APC power supply voltage control. This APC drain power supply voltage control is a method for AM modulation that is effective when the second RF power amplifier HPA2 executes AM modulation in the EDGE system with a high communication transfer rate in communication of DCS1800 and PCS900 and wideband AM modulation of WCDMA1900.

Transmission Operation in DCS1800 or PCS1900 by the Second RF Power Amplifier HPA2

The second RF power amplifier HPA2 power-amplifies the second RF transmission input signal Pin_HB at a frequency of 1710 MHz to 1785 MHz of DCS1800 or the second RF transmission input signal Pin_HB at a frequency of 1850 MHz to 1910 MHz of PCS100 to output the second RF transmission power signal Pout_HB at a frequency identical with the frequency of the RF transmission input signal inputted and transmits the second RF transmission power signal Pout_HB from an antenna of the cellular phone. This operation will be hereinafter explained.

At the time of transmission in DCS1800 or PCS1900, the second RF power amplifier HPA2 is required to be in a high transmission power mode for outputting the second RF transmission power signal Pout_HB of a maximum 33 dBm. In this case, a mode signal MODE at a low level is supplied to the RF power module RF_PAM1. In response to the mode signal MODE at the low level, the input side amplifier 1st_Stg_HB of the multi-stage amplifier of the second RF power amplifier HPA2 is set in a high gain state. Consequently, the second RF power amplifier HPA2 can output the second RF transmission power signal Pout_HB of DCS1800 or PCS1900 at a maximum 33 dBm.

In the embodiment explained with reference to FIG. 3, the input side amplifier 1st_Stg_HB of the multi-stage amplifier of the second RF power amplifier HPA2 is constituted by a negative feedback amplifier. The input side amplifier 1st_Stg_HB constituted by the negative feedback amplifier is controlled to have a small negative feedback amount in response to the mode signal MODE at the low level. Consequently, it is possible to set the input side amplifier 1st_Stg_HB in a high gain state.

A negative feedback variable resistor is connected between a drain and a gate of the N-MOS Q21 of the input side amplifier 1st_Stg_HB. A resistance of the negative feedback variable resistor is controlled to be a high resistance in response to the mode signal MODE at the low level. In the negative feedback variable resistor, a resistor R24 and a switch SW20 controlled to be on and off according to the mode signal MODE are connected in series at both ends of a resistor R23. A capacitor C23 separates the drain and the gate of the N-MOS Q21 in a DC manner. At the time of transmission in DCS1800 or PCS1900, the switch SW20 is controlled to be off in response to the mode signal MODE at the low level. Thus, a resistance of the negative feedback variable resistance is a high resistance generated by only the resistor R23. At the time of transmission in WCDMA1900, the mode signal MODE is at a high level and the switch SW20 is controlled to be on. Thus, a resistance of the negative feedback variable resistance is a low resistance generated by a parallel connection of the resistors R23 and R24. As shown in, for example, in the center left in FIG. 3, the switch SW20 is constituted by a C-MOS analog switch including a parallel connection of an N-MOS QNS and a P-MOS QPS and an inverter INV. The N-MOS QNS is turned on in response to the mode signal MODE at the low level and the P-MOS QPS is also turned off in response to an output at a high level of the inverter INV. As the switch SW20, it is also possible to use the RF-MEMS switch described in the Non-Patent Document 4.

Figure 6:
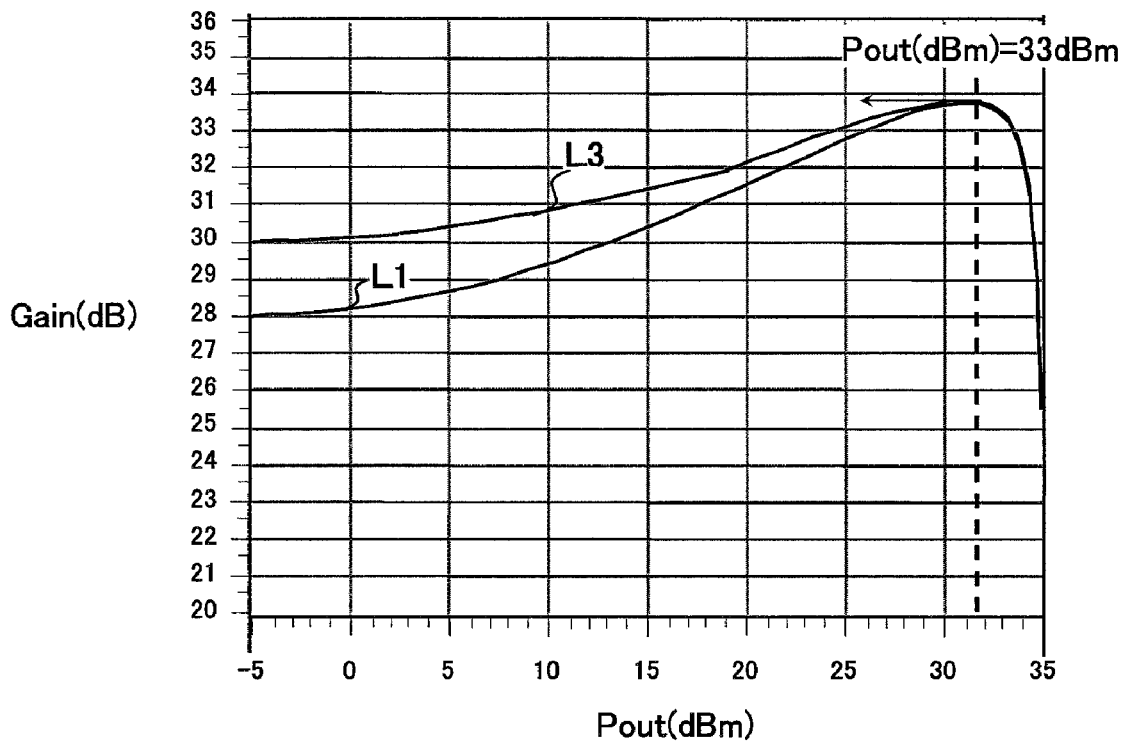
FIG. 6 is a graph showing a characteristic of an RF transmission power vs. an RF transmission power gain of a second RF power amplifier of an RF power module according to an embodiment of the present invention at the time of transmission in DCS1800 or PCS1900.

FIG. 6 is a graph showing a characteristic of an RF transmission power Pout (dBm) vs. an RF transmission power gain Gain (dB) of the second RF power amplifier HPA2 of the RF power module RF_PAM1 according to an embodiment of the present invention at the time of transmission in DCS1800 or PCS1900. A characteristic L1 in FIG. 6 indicates a characteristic of the second RF power amplifier HPA2 in the state in which, in the embodiment explained with reference to FIG. 3, the switch SW20 of the negative feedback variable resistor between the drain and the gate of the N-MOS Q21 of the input side amplifier 1st_Stg_HB is controlled to be off in response to the mode signal MODE at the low level. In the characteristic L1, in the case of the RF transmission input power Pout of 33 dBm, a relatively high RF transmission power gain Gain (dB) of 33.8 dB is obtained.

As a bias circuit of a semiconductor integrated circuit, in order to compensate for fluctuation in a bias current due to fluctuation in a semiconductor manufacturing process, a temperature change, and the like, a bias system of a current mirror type is adopted as it is well known. Making use of the fact that pair performance of two amplification elements manufactured in an identical semiconductor manufacturing process is high in the semiconductor integrated circuit, one end and the other end of one element of the two amplification elements are connected in parallel between an input electrode of a gate and a base and a ground electrode of a source and an emitter of the other element of the two amplification elements. The one end of one element is an electrical connection of the output electrode of a drain and a collector and an input electrode of a base of one element. The other end of one element is a ground electrode of a source and an emitter of one element. By adopting the bias system of the current mirror type, it is possible to compensate for fluctuation in a bias current and an idling current caused by fluctuation in a threshold voltage of the amplification elements due to fluctuation in the semiconductor manufacturing process, a temperature change, and the like.

In the embodiment explained with reference to FIG. 3, the N-MOS Q11 of the input side amplifier 1st_Stg_LB of the multi-stage amplifier and a diode-connected N-MOS Q14 of the input side bias circuit 1st_BC_LB of the first RF power amplifier HPA1 are connected in a form of the bias system of the current mirror type via the voltage follower VF11 formed by the internal amplifier OP11. The N-MOS Q12 of the output side amplifier 2nd_Stg_LB of the multi-stage amplifier and a diode-connected N-MOS Q15 of the output side bias circuit 2nd_BC_LB of the first RF power amplifier HPA1 are connected in a form of the bias system of the current mirror type via the voltage follower VF12 formed by the internal amplifier OP12. Similarly, the N-MOS Q21 of the input side amplifier 1st_Stg_HB of the multi-stage amplifier and a diode-connected N-MOS Q24 of the input side bias circuit 1st_BC_HB of the second RF power amplifier HPA2 are connected in a form of the bias system of the current mirror type via the voltage follower VF21 formed by the internal amplifier OP21. The N-MOS Q22 of the output side amplifier 2nd_Stg_HB of the multi-stage amplifier and a diode-connected N-MOS Q25 of the output side bias circuit 2nd_BC_HB of the second RF power amplifier HPA2 are connected in a form of the bias system of the current mirror type via the voltage follower VF22 formed by the internal amplifier OP22.

Figure 8:
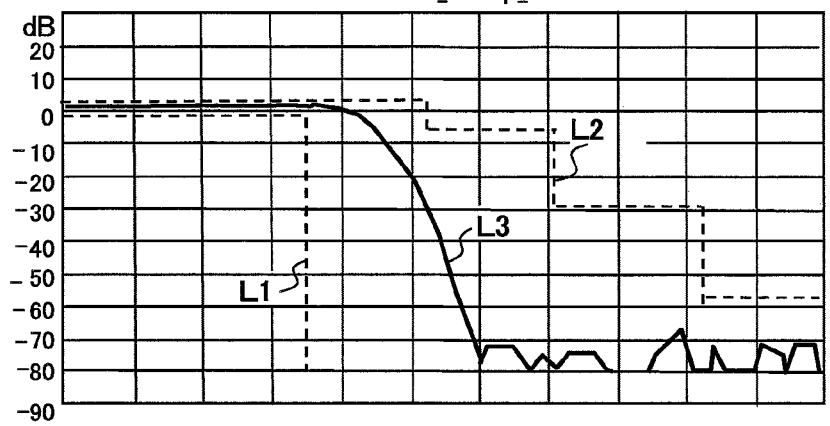
FIG. 8 is a graph showing ramp-down of a transmission power prescribed by the GSM standard.
Figure 9:
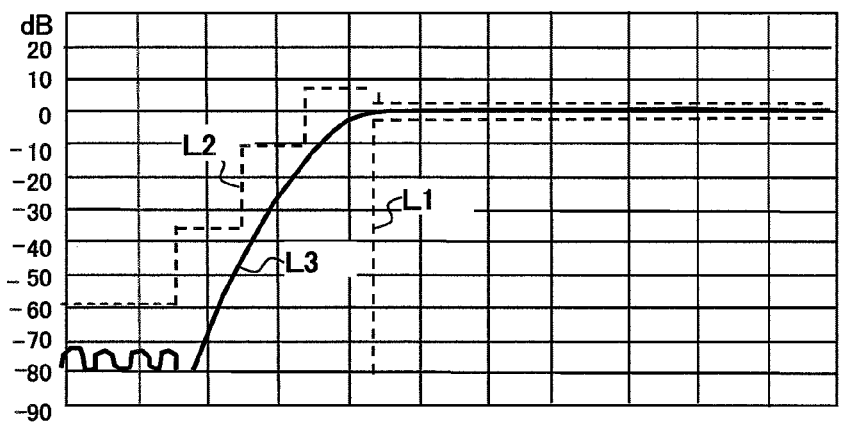
FIG. 9 is a graph showing ramp-up of a transmission power prescribed by the GSM standard.
Figure 10:
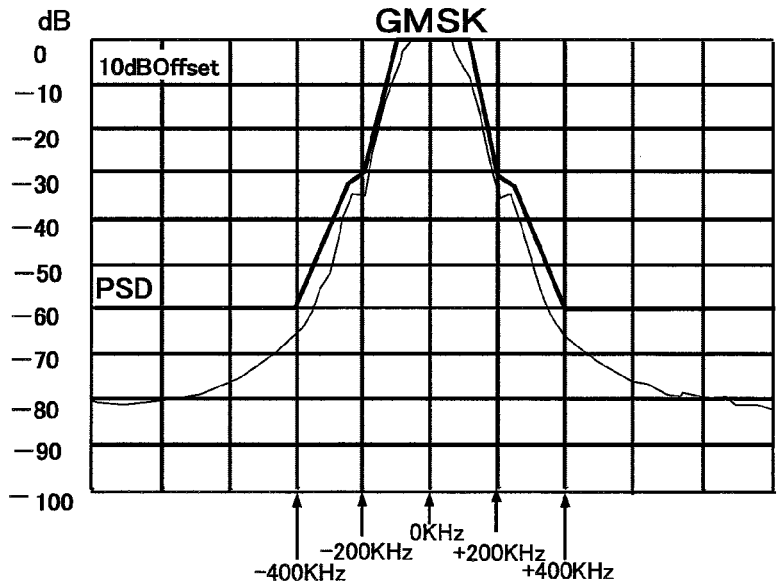
FIG. 10 is a graph showing a frequency spectrum of an RF transmission signal of a cellular phone terminal prescribed by the standard of GMSK.

The voltage follower VF11 formed by the internal amplifier OP11 and the voltage follower VF12 formed by the internal amplifier OP12 of the first RF power amplifier HPA1 operate to cause a bias voltage of the N-MOS Q11 of the input side amplifier 1st_Stg_LB and a bias voltage of the N-MOS Q12 of the output side amplifier 2nd_Stg_LB of the multi-stage amplifier of the first RF power amplifier HPA1 to respond to a change in the ramp voltage Vramp at high speed such that the ramp-down characteristic L3 shown in FIG. 8 and the ramp-up characteristic L3 shown in FIG. 9 prescribed by the GSM standard are attained when the first RF power amplifier HPA1 executes a transmission operation in GSM850 or GSM900.

Similarly, the voltage follower VF21 formed by the internal amplifier OP21 and the voltage follower VF22 formed by the internal amplifier OP22 of the second RF power amplifier HPA2 operate to cause a bias voltage of the N-MOS Q21 of the input side amplifier 1st_Stg_HB and a bias voltage of the N-MOS Q22 of the output side amplifier 2nd_Stg_HB of the multi-stage amplifier of the second RF power amplifier HPA2 to respond to a change in the ramp voltage Vramp at high speed such that the ramp-down characteristic L3 shown in FIG. 8 and the ramp-up characteristic L3 shown in FIG. 9 prescribed by the GSM standard are attained when the second RF power amplifier HPA2 executes a transmission operation in DCS1800 or PCS1900.

Transmission Operation in WCDMA1900 by the Second RF Power Amplifier HPA2

The second RF power amplifier HPA2 power-amplifies the second RF transmission input signal Pin_HB at a frequency of 1920 MHz to 1980 MHz of WCDMA1900 to output the second RF transmission power signal Pout_HB of a frequency identical with the frequency of the RF transmission input signal inputted and transmits the second RF transmission power signal Pout_HB from the antenna of the cellular phone. This operation will be hereinafter explained.

At the time of transmission in WCDMA1900, the second RF power amplifier HPA2 is required to be in a low transmission power mode for outputting the second RF transmission power signal Pout_HB of a maximum 28 dBm to 29 dBm. In this case, a mode signal MODE at a high level is supplied to the RF power module RF_PAM1. In response to the mode signal MODE at the high level, the input side amplifier 1st_Stg_HB of the multi-stage amplifier of the second RF power amplifier HPA2 is set in a low gain state. Consequently, the second RF power amplifier HPA2 can output the second RF transmission power signal Pout_HB of WCDMA1900 of a maximum 28 dBm to 29 dBm.

In the embodiment explained with reference to FIG. 3, the switch SW20 of the negative feedback variable resistor between the drain and the gate of the N-MOS Q21 of the input side amplifier 1st_Stg_HB is controlled to be on in response to the mode signal MODE at the high level. Thus, a resistance of the negative feedback variable resistor is a low resistance generated by a parallel connection of the resistors R23 and R24. The input side amplifier 1st_Stg_HB comes into a low gain state.

Figure 7:
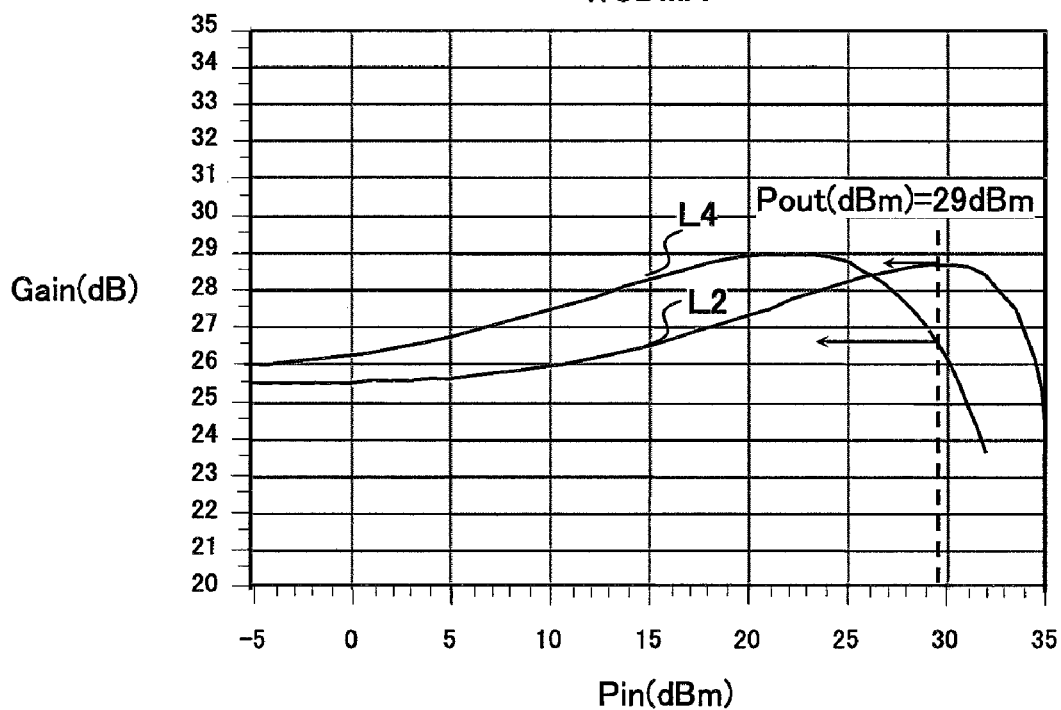
FIG. 7 is a graph showing a characteristic of an RF transmission power vs. an RF transmission power gain of the second RF power amplifier of the RF power module according to the embodiment of the present invention at the time of transmission in WCDMA1900.

FIG. 7 is a graph showing a characteristic of an RF transmission power Pout (dBm) vs. an RF transmission power gain Gain (dB) of the second RF power amplifier HPA2 of the RF power module RF_PAM1 according to an embodiment of the present invention at the time of transmission in WCDMA 1900. A characteristic L2 in FIG. 7 indicates a characteristic of the second RF power amplifier HPA2 in the state in which, in the embodiment explained with reference to FIG. 3, the switch SW20 of the negative feedback variable resistor between the drain and the gate of the N-MOS Q21 of the input side amplifier 1st_Stg_HB is controlled to be on in response to the mode signal MODE at the high level. In the characteristic L2, in the case of the RF transmission input power Pout (dBm) of 29 dBm, a relatively low RF transmission power gain Gain (dB) of 28.8 dB is obtained. It can be understood that the RF transmission power gain Gain (dB) indicated by the characteristic L2 in FIG. 7 at the time of transmission in WCDMA1900 is generally lower than the RF transmission power gain Gain (dB) indicated by the characteristic L1 in FIG. 6 at the time of transmission in DCS1800 or PCS1900.

In the embodiment explained with reference to FIG. 3, the voltage follower VF21 formed by the internal amplifier OP21 and the voltage follower VF22 formed by the internal amplifier OP22 of the second RF power amplifier HPA2 are controlled to be in an inactive state in response to the mode signal MODE at the high level. On the other hand, a bypass switch SW21 between the input and the output of the internal amplifier OP21 and a bypass switch SW22 between the input and the output of the internal amplifier OP22 are controlled to be on. Therefore, when the second power amplifier HPA2 amplifies the second RF transmission input signal Pin_HB of WCDMA1900, the second input side voltage follower VF21 and the second output side voltage follower VF22 of the second power amplifier HPA2 are controlled to be in an inactive state. Thus, output noise of the second input side voltage follower VF21 and output noise of the second output side voltage follower VF22 are not amplified by a wideband characteristic in 3.58 MHz of the second RF power amplifier HPA2 and it is possible to improve a noise characteristic. Like the switch SW20 of the negative feedback variable resistor between the drain and the gate of the N-MOS Q21 of the input side amplifier 1st_Stg_HB, the bypass switches SW21 and SW22 can also be constituted by C-MOS analog switches or RF-MEMS switches.

All of the N-MOS Q11 of the input side amplifier 1st_Stg_LB and the N-MOS Q12 of the output side amplifier 2nd_Stg_LB of the multi-stage amplifier of the first RF power amplifier HPA1 and the N-MOS Q21 of the input side amplifier 1st_Stg_HB and the N-MOS Q22 of the output side amplifier 2nd_Stg_HB of the multi-stage amplifier of the second RF power amplifier HPA2 are N-channel power MOS transistors suitable for RF amplification called LDMOS (Lateral Diffused MOS). However, it is possible to replace the transistors with other RF power amplification elements such as an HBT (hetero bipolar transistor).

Other Embodiments

Figure 4:
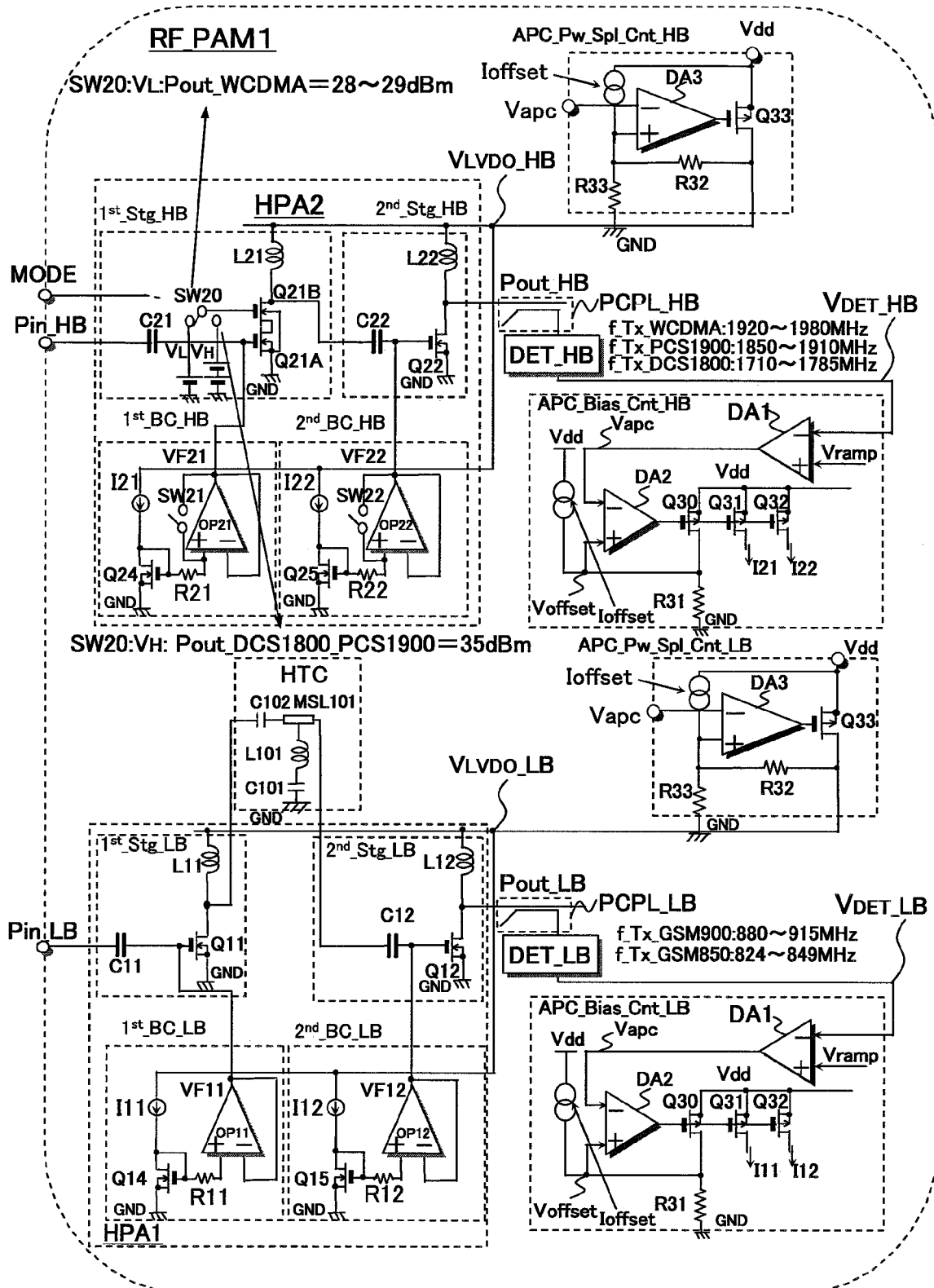
FIG. 4 is a circuit diagram showing an RF power amplifier according to another embodiment of the present invention.

FIG. 4 is a circuit diagram showing an RF power amplifier according to another embodiment of the present invention.

The embodiment explained with reference to FIG. 4 is different from the embodiment explained with reference to FIG. 3 in a circuit structure of the input side amplifier 1st_Stg_HB of the multi-stage amplifier of the second RF power amplifier HPA2.

In FIG. 3, the input side amplifier 1st_Stg_HB of the multi-stage amplifier of the second RF power amplifier HPA2 is constituted by the negative feedback amplifier that controls, according to a mode signal, a resistance of the negative feedback variable resistor between the drain and the gate of the source-grounded N-MOS Q21.

In FIG. 4, the input side amplifier 1st_Stg_HB of the multi-stage amplifier of the second RF power amplifier HPA2 includes a source-grounded N-MOS Q21A and a control amplification element Q21B connected between the N-MOS Q21A and the inductor L21 serving as a load element. A gain control voltage $V_H$ or $V_L$ is applied to an input terminal of the control amplification element Q21B. When the second power amplifier HPA2 amplifies the second RF transmission input signal Pin_HB of DCS1800 or PCS1900, a gain control voltage is set to a high level $V_H$ of, for example, 2.3 volts. When the second power amplifier HPA2 amplifies the second RF transmission input signal Pin_HB of WCDMA1900, a gain control voltage is set to a low level $V_L$ of, for example, 1.8 volts.

When the second RF transmission power signal Pout_HB of DCS1800 or PCS1900 is outputted, the gain control voltage at the high level $V_H$ of 2.3 volts is supplied to the input terminal of the control amplification element Q21B via the switch SW20 in response to the mode signal MODE at the low level. A mutual conductance of the control amplification element Q21B is controlled to be high. Therefore, the input side amplifier 1st_Stg_HB of the multi-stage amplifier of the second RF power amplifier HPA2 is controlled to be in a state of a high gain and can output the second RF transmission power signal Pout_HB of a maximum 35 dBm of DCS1800 or PCS1900. A characteristic L3 in FIG. 6 indicates a characteristic of the second RF power amplifier HPA2 in the state in which, in the embodiment explained with reference to FIG. 4, the gain control voltage at the high level $V_H$ of 2.3 volts is supplied to the input terminal of the control amplification element Q21B via the switch SW20 in response to the mode signal MODE at the low level. In the characteristic L3, in the case of the RF transmission input power Pout (dBm) of 33 dBm, a relatively high RF transmission power gain Gain (dB) of 33.8 dB is obtained.

When the second RF transmission power signal Pout_HB of WCDMA1900 is outputted, the gain control voltage at the low level $V_L$ of 1.8 volts is supplied to the input terminal of the control amplification element Q21B via the switch SW20 in response to the mode signal MODE at the high level. A mutual conductance of the control amplification element Q21B is controlled to be low. Therefore, the input side amplifier 1st_Stg_HB of the multi-stage amplifier of the second RF power amplifier HPA2 is controlled to be in a state of a low gain and can output the second RF transmission power signal Pout_HB of a maximum 28 dBm to 29 dBm of WCDMA1900. A characteristic L4 in FIG. 7 indicates a characteristic of the second RF power amplifier HPA2 in the state in which, in the embodiment explained with reference to FIG. 4, the gain control voltage at the high level $V_L$ of 1.8 volts is supplied to the input terminal of the control amplification element Q21B via the switch SW20 in response to the mode signal MODE at the low level. In the characteristic L4, in the case of the RF transmission input power Pout (dBm) of 29 dBm, a relatively low RF transmission power gain Gain (dB) of 26.7 dB is obtained. It can be understood that the RF transmission power gain Gain (dB) indicated by the characteristic L4 in FIG. 7 at the time of transmission in WCDMA1900 is generally lower than the RF transmission power gain Gain (dB) indicated by the characteristic L3 in FIG. 6 at the time of transmission in DCS1800 or PCS1900.

In the input side amplifier 1st_Stg_HB, the source-grounded or emitter-grounded input side amplification element Q21A and the cascaded control amplification element Q21B operate as gate-grounded or base-grounded elements. Thus, it is possible to obtain a high frequency characteristic suitable for RF transmission in WCDMA1900 with an extremely high transmission frequency of 1920 MHz to 1980 MHz.

The source-grounded N-MOS Q21A and the gate-grounded N-MOS Q21B of the input side amplifier 1st_Stg_HB can be constituted by one LDMOS having a dual gate structure.

Figure 5:
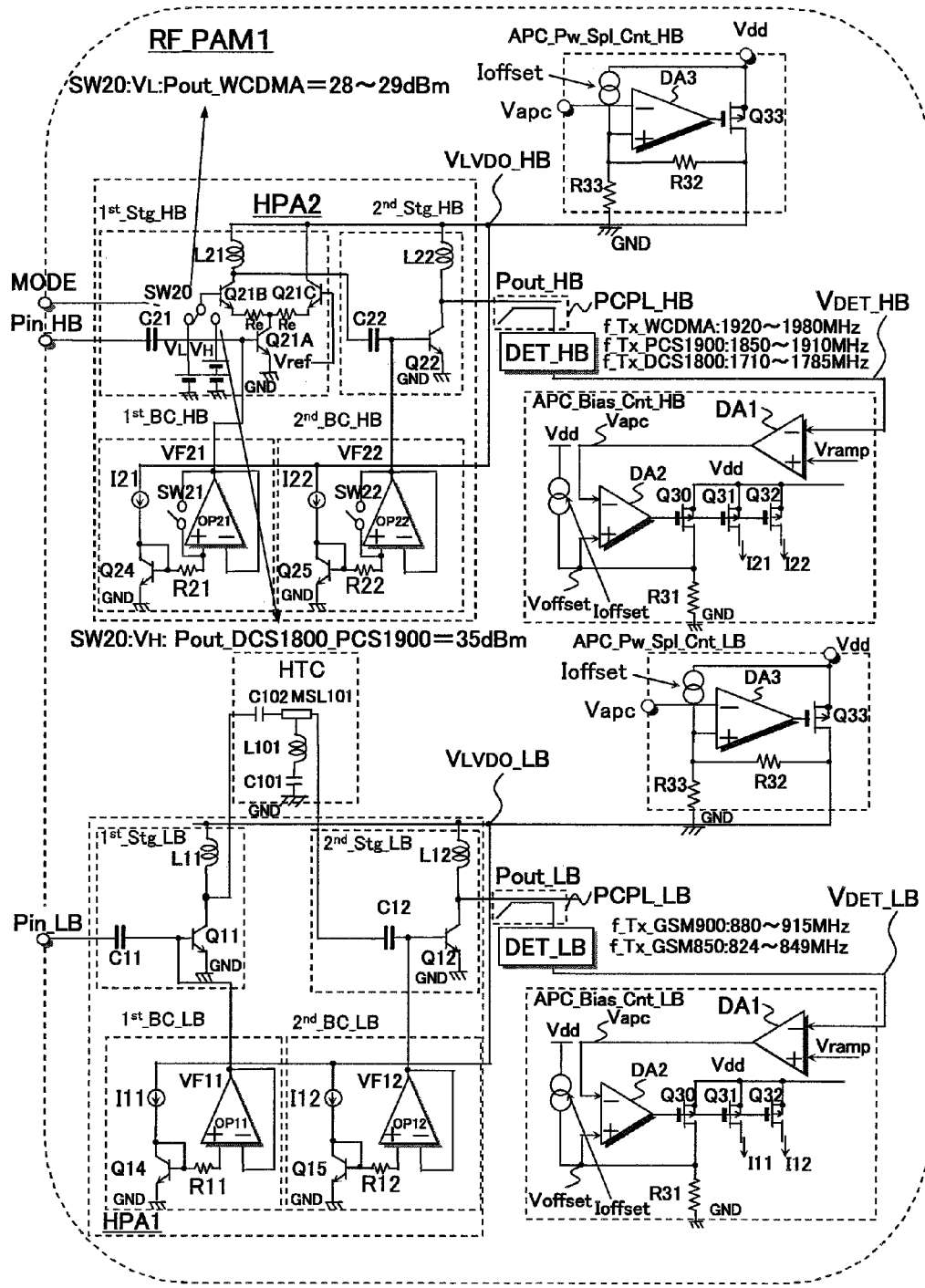
FIG. 5 is a circuit diagram showing an RF power amplifier according to still another embodiment of the present invention.

FIG. 5 is a circuit diagram showing an RF power amplifier according to still another embodiment of the present invention.

The embodiment explained with reference to FIG. 5 is different from the embodiments explained with reference to FIGS. 3 and 4 in that all of the amplification element Q11 of the input side amplifier 1st_Stg_LB, the amplification element Q12 of the output side amplifier 2nd_Stg_LB, the bias element Q14 of the input side bias circuit 1st_BC_LB, and the bias element Q15 of the output side bias circuit 2nd_BC_LB of the multi-stage amplifier of the first RF power amplifier HPA1 and the amplification element Q21 of the input side amplifier 1st_Stg_HB, the amplification element Q22 of the output side amplifier 2nd_Stg_HB, the bias element Q24 of the input side bias circuit 1st_BC_HB, and the bias element Q25 of the output side bias circuit 2nd_BC_HB of the multi-stage amplifier of the second RF power amplifier HPA2 are constituted by HBTs (hetero bipolar transistors) of SiGe, GaAs, InP, InGaP, or the like. The input side amplifier 1st_Stg_HB of the multi-stage amplifier of the second RF power amplifier HPA2 includes an emitter-grounded HBT Q21A, an HBT Q21B connected between the HBT Q21A and the inductor L21 serving as a load element, and an HBT Q21C connected to the HBT Q21B via two emitter resistors Re. A gain control voltage $V_H$ or $V_L$ is applied to a base input terminal of the HBT Q21B and a reference voltage Vref at an intermediate level of the gain control voltages $V_H$ and $V_L$ is applied to a base input terminal of the HBT Q21C. When the second power amplifier HPA2 amplifies the second RF transmission input signal Pin_HB of DSC1800 or PCS1900, a gain control voltage is set to a high level $V_H$ of, for example, 2.3 volts. When the second power amplifier HPA2 amplifies the second RF transmission input signal Pin_HB of WCDMA1900, a gain control voltage is set to a low level $V_L$ of, for example, 1.8 volts.

When the second RF transmission power signal Pout_HB of DCS1800 or PCS1900 is outputted, the gain control voltage at the high level $V_H$ of 2.3 volts is supplied to the base input terminal of the HBT Q21B via the switch SW20 in response to the mode signal MODE at the low level. Therefore, an emitter current of the HBT Q21B increases to be larger than an emitter current of the HBT Q21C and a mutual conductance of the HBT Q21B is controlled to be high. Therefore, the input side amplifier 1st_Stg_HB of the multi-stage amplifier of the second RF power amplifier HPA2 is controlled to be in a state of a high gain. The second RF power amplifier HPA2 can output the second RF transmission power signal Pout_HB of a maximum 35 dBm of DCS1800 or PCS1900.

When the second RF transmission power signal Pout_HB of WCDMA1900 is outputted, the gain control voltage at the low level $V_L$ of 1.8 volts is supplied to the base input terminal of the HBT Q21B via the switch SW20 in response to the mode signal MODE at the high level. Therefore, an emitter current of the HBT Q21B decreases to be smaller than an emitter current of the HBT Q21C and a mutual conductance of the HBT Q21B is controlled to be in a low state. Therefore, the input side amplifier 1st_Stg_HB of the multi-stage amplifier of the second RF power amplifier HPA2 is controlled to be in a state of a low gain. The second RF power amplifier HPA2 can output the second RF transmission power signal Pout_HB of a maximum 28 dBm to 29 dBm of WCDMA1900.

Specific Structure of an RF Power Module

Figure 11:
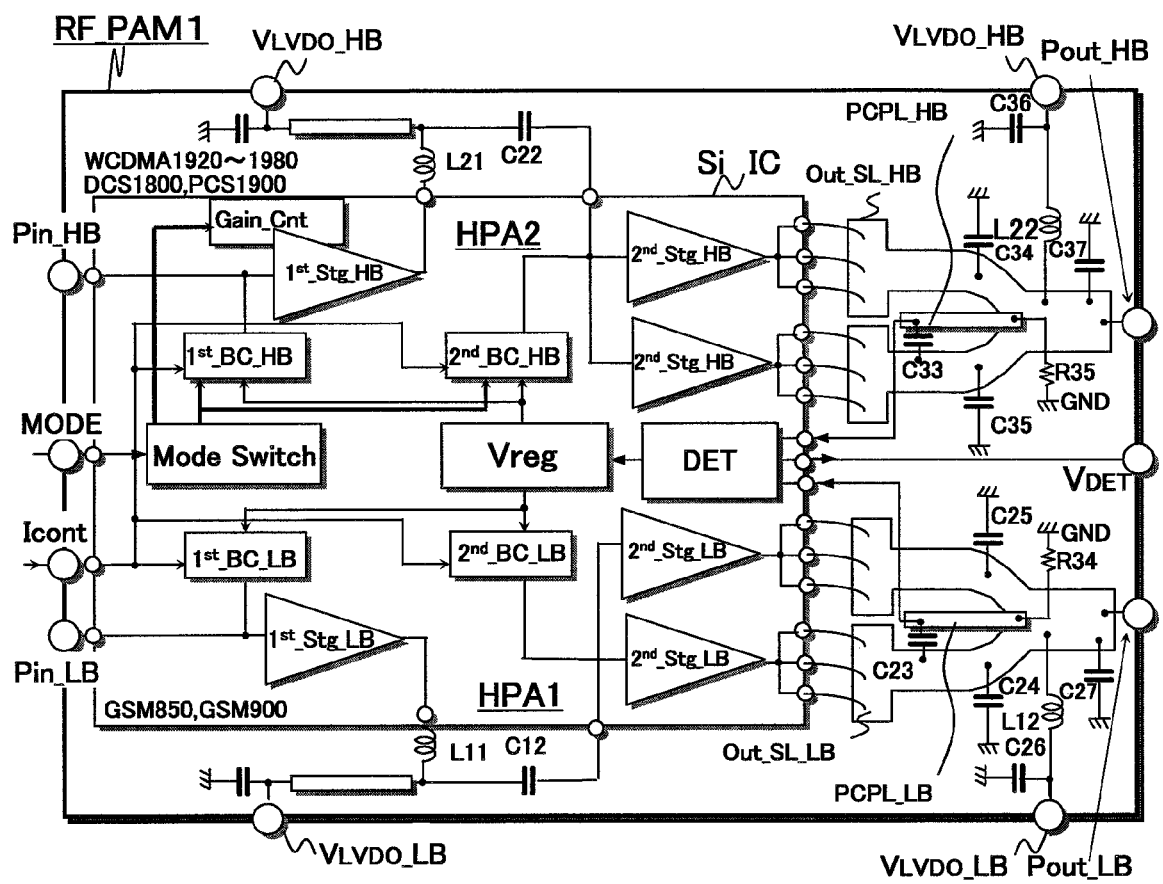
FIG. 11 is a diagram showing a specific structure of an RF power module RF_PAM1 according to still another embodiment of the present invention.

FIG. 11 is a diagram showing a specific structure of an RF power module RF_PAM 1 according to still another embodiment of the present invention.

As shown in the figure, the RF power module RF_PAM1 according to this embodiment is built in one package. As in the third embodiment, all amplification elements such as an N-channel LDMOS and a P-channel MOSFET for forming the internal amplifiers OP11 to OP22 and the differential amplifiers DA1 and DA2 for power control, bias control, and the like are formed on a chip of one silicon semiconductor integrated circuit Si IC. The first RF power amplifier HPA1 for transmitting frequencies of GSM850 and GSM900 is arranged in a lower part the chip of the silicon semiconductor integrated circuit Si IC. The second RF power amplifier HPA2 for transmitting frequencies of DSC1800, PCS1900, and WCDMA1900 is arranged in an upper part of the chip. A power detector DET, a voltage regulator Vreg, and a mode switch control circuit Mode Switch to which the mode signal MODE is supplied are arranged in the center of the chip. This silicon semiconductor integrated circuit Si IC is arranged on a wiring substrate of the RF power module RF_PAM1. The inductors L11, L12, L21, and L22 as load elements, passive elements such as a large number of capacitor elements C12, C22, and the like, two power couplers PCPL_LB and PCPL_HB, two strip lines for output OUT_SL_LB and OUT_ST_HB, and the like are arranged on this wiring substrate.

The output side amplifier 2nd_Stg_LB of the first RF power amplifier HPA1 is constituted by two amplifiers connected in parallel. The output side amplifier 2nd_Stg_HB of the second RF power amplifier HPA2 is also constituted by two amplifiers connected in parallel. Two inputs of the two output side amplifiers 2nd_Stg_LB connected in parallel of the first RF power amplifier HPA1 are driven in parallel by an output of the input side amplifier 1st_Stg_LB. Similarly, two inputs of the two output side amplifiers 2nd_Stg_HB connected in parallel of the second RF power amplifier HPA2 are also driven in parallel by an output of the input side amplifier 1st_Stg_HB. Two outputs of the two output side amplifiers 2nd_Stg_LB connected in parallel of the first RF power amplifier HPA1 are supplied to two inputs of a strip line for output combination OUT_SL_LB of a Y shape. The first RF transmission power signal Pout_LB of GSM850 or GSM900 is outputted from an output of the strip line for output combination OUT_SL_LB of a Y shape. Similarly, two outputs of the two output side amplifiers 2nd_Stg_HB connected in parallel of the second RF power amplifier HPA2 are supplied to two inputs of a strip line for output combination OUT_SL_HB of a Y shape. The second RF transmission power signal Pout_HB of DCS1800, PCS1900, or WCDMA1900 is outputted from an output of the strip line for output combination OUT_SL_HB of a Y shape. A power detection signal $V_{DET}$ of the power detector DET is outputted from the right side of the RF power module RF_PAM1. The first RF transmission input signal Pin_LB of GSM850 or GSM900, the second RF transmission input signal Pin_HB of DCS1800, PCS1900, or WCDMA1900, the mode signal MODE, and the APC gain control signal Icon are supplied from the left side of the RF power module RF_PAM1.

When the second RF power amplifier HPA2 outputs the second RF transmission power signal Pout_HB of DCS1800 or PCS1900, the input side amplifier 1st_Stg_HB of the second RF power amplifier HPA2 is controlled to be in a state of a high gain by a gain control circuit Gain_Cnt in response to the mode signal MODE at the low level. In this case, the voltage followers in the input side bias circuit 1st_BC_HB and the output side bias circuit 2nd_BC_HB of the second RF power amplifier HPA2 are activated. A high-speed response of a bias voltage to a ramp voltage change necessary for ramp-up and ramp-down of TDMA is realized.

When the second RF power amplifier HPA2 outputs the second RF transmission power signal Pout_HB of WCDMA1900, the input side amplifier 1st_Stg_HB of the second RF power amplifier HPA2 is controlled to be in a state of a low gain by the gain control circuit Gain_Cnt in response to the mode signal MODE at the high level. In this case, the voltage followers in the input side bias circuit 1st_BC_HB and the output side bias circuit 2nd_BC_HB of the second RF power amplifier HPA2 are activated. Output noise of the voltage followers harmful for a low noise characteristic of the WCDMA system of a wideband characteristic in 3.84 MHz is inhibited.

The present invention has been specifically explained on the basis of the embodiments. However, the present invention is not limited to the embodiments. It goes without saying that various modifications of the embodiments are possible without departing from the spirit of the invention.

For example, in FIG. 3, other than the power couplers PCPL_LB and PCPL_HB for detecting a transmission power level for detecting a transmission power of the RF power amplifier, it is possible to adopt a current sense shape detector. In this current sense shape detector, a detection amplification element is connected in parallel to a last stage power amplification element of the RF power amplifier and a small detection DC/AC operation current proportional to a DC/AC operation current of the last stage power amplification element is fed to the detection amplification element.

Moreover, in the embodiment explained with reference to FIG. 3, as the negative feedback variable resistor between the drain and the gate of the N-MOS Q21 of the input side amplifier 1st_Stg_HB of the second RF power amplifier HPA2, it is also possible to use parallel connection of a first CMOS analog switch having a high on-resistance and a second CMOS analog switch having a low on-resistance. At the time of transmission in DCS1800 or PCS1900, the first CMOS analog switch having a high on-resistance is turned on and the second CMOS analog switch having a low on-resistance is turned off in response to the mode signal MODE at the low level. Consequently, it is possible to set the input side amplifier 1st_Stg_HB in a high gain state. At the time of transmission in WCDM1900, the first CMOS analog switch having a high on-resistance is turned off and the second CMOS analog switch having a low on-resistance is turned on in response to the mode signal MODE at the high level. Consequently, it is possible to set the input side amplifier 1st_Stg_HB in a low gain state.

In FIG. 5, in order to control thermal runway of the HBT Q12 of the output side amplifier 2nd_Stg_LB and the HBT Q22 of the output side amplifier 2nd_Stg_HB, it is recommended that a base ballast or emitter ballast resistor be connected to the HBTs.

Moreover, it is also possible to replace the LDMOSs and the hetero bipolar transistors with N-channel field effect transistor MESFETs or HEMTs of chemical semiconductors of GaAs, InP, or the like.

What is claimed is:

1. An RF power amplifier comprising:
a first power amplifier that amplifies a first RF transmission input signal of GSM850 and GSM900; and
a second power amplifier that amplifies a second RF transmission input signal of DCS1800, PCS1900, and WCDMA1900, wherein
the first power amplifier is constituted by a first multi-stage amplifier including at least a first input side amplifier and a first output side amplifier,
the second power amplifier is constituted by a second multi-stage amplifier including at least a second input side amplifier and a second output side amplifier,
when the second power amplifier amplifies the second RF transmission input signal of WCDMA1900, a gain of the second input side amplifier of the second multi-stage amplifier is set to a low gain in response to a mode signal of a predetermined signal, and
when the second power amplifier amplifies the second RF transmission input signal of DCS1800 or PCS1900, the gain of the second input side amplifier of the second multi-stage amplifier is set to a gain higher than the low gain in response to a change of the mode signal to a signal different from the predetermined signal.

2. An RF power amplifier according to claim 1, wherein
a first bias circuit including a first voltage follower is connected to the first multi-stage amplifier of the first power amplifier and a second bias circuit including a second voltage follower is connected to the second multi-stage amplifier of the second power amplifier, for ramp-up and ramp-down in a TDMA system in GSM transmission in GSM850 or GSM900 by the first power amplifier, the first bias circuit controls a level of a bias voltage supplied to an input electrode of an amplification element of the first multi-stage amplifier of the first power amplifier by using the first voltage follower in response to a level of a gain control signal, in transmission in WCDMA1900 by the second power amplifier, the second voltage follower of the second bias circuit is controlled to be in an inactive state in response to the mode signal of the predetermined signal and the second bias circuit controls, in response to a level of the gain control signal, a level of a bias voltage supplied to an input electrode of an amplification element of the second multi-stage amplifier of the second power amplifier, and for ramp-up and ramp-down in the TDMA system in the GSM transmission of DCS1800 or PCS1900 by the second power amplifier, the second voltage follower of the second bias circuit is controlled to be in an inactive state in response to the mode signal of the different signal and the second bias circuit controls, in response to a level of the gain control signal, a level of a bias voltage supplied to the input electrode of the amplification element of the second multi-stage amplifier of the second power amplifier by using the second voltage follower controlled to be in the inactive state.

3. An RF power amplifier according to claim 1, wherein
the first power amplifier further includes a first input side bias circuit and a first input side voltage follower for the first input side amplifier of the first multi-stage amplifier,
the first input side bias circuit generates a first input side bias voltage that changes in response to a level of a gain control signal for ramp-up and ramp-down in the TDMA system in the GSM communication,
the first input side bias voltage generated by the first input side bias circuit is supplied to the input electrode of the first input side amplification element of the first input side amplifier of the first multi-stage amplifier of the first power amplifier via the first input side voltage follower,
the second power amplifier further includes a second input side bias circuit and a second input side voltage follower for the second input side amplifier of the second multi-stage amplifier,
the second input side bias circuit generates a second input side bias voltage that changes in response to a level of the gain control signal for ramp-up and ramp-down in the TDMA system in the GSM communication,
the second input side bias voltage generated by the second input side bias circuit is supplied to the input electrode of the second input side amplification element of the second input side amplifier of the second multi-stage amplifier of the second power amplifier via the second input side voltage follower, and
when the second power amplifier amplifies the second RF transmission input signal of WCDMA1900, the second input side voltage follower of the second power amplifier is controlled to be in an inactive state in response to the mode signal of the predetermined signal and the second input side bias voltage generated by the second input side bias circuit is supplied to the input electrode of the second input side amplification element bypassing the second input side voltage follower controlled to be in the inactive state.

4. An RF power amplifier according to claim 3, wherein
the first power amplifier further includes a first output side bias circuit and a first output side voltage follower for the first output side amplifier of the first multi-stage amplifier,
the first output side bias circuit generates a first output side bias voltage that changes in response to a level of the gain control signal for ramp-up and ramp-down in the TDMA system in the GSM communication,
the first output side bias voltage generated by the first output side bias circuit is supplied to the input electrode of the first output side amplification element of the first output side amplifier of the first multi-stage amplifier of the first power amplifier via the first output side voltage follower,
the second power amplifier further includes a second output side bias circuit and a second output side voltage follower for the second output side amplifier of the second multi-stage amplifier,
the second output side bias circuit generates a second output side bias voltage that changes in response to a level of the gain control signal for ramp-up and ramp-down in the TDMA system in the GSM communication,
the second output side bias voltage generated by the second output side bias circuit is supplied to the input electrode of the second output side amplification element of the second output side amplifier of the second multi-stage amplifier of the second power amplifier via the second output side voltage follower, and
when the second power amplifier amplifies the second RF transmission input signal of WCDMA1900, the second output side voltage follower of the second power amplifier is controlled to be in an inactive state in response to the mode signal of the predetermined signal and the second output side bias voltage generated by the second output side bias circuit is supplied to the input electrode of the second output side amplification element bypassing the second output side voltage follower controlled to be in the inactive state.

5. An RF power amplifier according to claim 1, wherein
a frequency of the second RF transmission input signal is set to be about twice as high as a frequency of the first RF transmission input signal, and
the first power amplifier includes a harmonic trap circuit that bypasses the two-fold harmonic of the first RF transmission input signal to a ground potential point.

6. An RF power amplifier according to claim 1, wherein
the second input side amplifier of the second multi-stage amplifier of the second power amplifier is constituted by a negative feedback amplifier, and
a negative feedback amount of the second input side amplifier constituted by the negative feedback amplifier at the time when the mode signal is the predetermined signal is set to be larger than a negative feedback amount of the second input side amplifier constituted by the negative feedback amplifier at the time when the mode signal is the different signal.

7. An RF power amplifier according to claim 6, wherein
the second input side amplifier of the second multi-stage amplifier of the second power amplifier includes a negative feedback variable resistor connected between the output electrode and the input electrode of the second input side amplification element,
when the mode signal is the predetermined signal, a resistance of the negative feedback variable resistor is controlled to be a low resistance, and
when the mode signal is the different signal, the resistance of the negative feedback variable resistor is controlled to be a high resistance higher than the low resistance.

8. An RF power amplifier according to claim 1, wherein
the second input side amplifier of the second multi-stage amplifier of eh second power amplifier further includes a control amplification element connected between the output electrode of the second input side amplification element and a load element,
a gain control voltage is applied to the input electrode of the control amplification element,
when the second power amplifier amplifies the second RF transmission input signal of the DCS1800 or PCS1900, the gain control voltage is set to a high level, and
when the second power amplifier amplifies the second RF transmission input signal of WCDMA1900, the gain control voltage is set to a low level lower than the high level.

9. An RF power amplifier according to claim 1, wherein the first input side amplification element, the second input side amplification element, the first output side amplification element, and the second output side amplification element of the first power amplifier and the second power amplifier are field effect transistors.

10. An RF power amplifier according to claim 9, wherein the field effect transistors are lateral double diffused MOSs (LDMOSs).

11. An RF power amplifier according to claim 1, wherein the first input side amplification element, the second input side amplification element, the first output side amplification element, and the second output side amplification element of the first power amplifier and the second power amplifier are bipolar transistors.

12. An RF power amplifier according to claim 11, wherein the bipolar transistors are heterojunction bipolar transistors.

13. An RF power amplifier according to claim 1, wherein the first power amplifier, the second power amplifier, and a power detector that detects transmission power levels of the first power amplifier and the second power amplifier are mounted on a package of an RF power module.

14. An RF power amplifier comprising:
a first power amplifier that amplifies a first RF transmission input signal of a TDMA system having a first frequency band of about 0.8 GHz to 1.0 GHz; and
a second power amplifier that amplifies a second RF transmission input signal of the TDMA system having a second frequency band of about 1.7 GHz to 2.0 GHz and a third RF transmission input signal of a WCDMA system having a third frequency band of about 1.7 GHz to 2.0 GHz, wherein
the first power amplifier is constituted by a first multi-stage amplifier including at least a first input side amplifier and a first output side amplifier,
the second power amplifier is constituted by a second multi-stage amplifier including at least a second input side amplifier and a second output side amplifier,
when the second power amplifier amplifies the third RF transmission input signal of the WCDMA system, a gain of the second input side amplifier of the second multi-stage amplifier is set to a low gain in response to a mode signal of a predetermined signal, and
when the second power amplifier amplifies the second RF transmission input signal of the TDMA system, since the mode signal is changed to a signal different from the predetermined signal, the gain of the second input side amplifier of the second multi-stage amplifier is set to a high gain higher than the low gain.

15. An RF power amplifier according to claim 14, wherein
a first bias circuit including a first voltage follower is connected to the first multi-stage amplifier of the first power amplifier and a second bias circuit including a second voltage follower is connected to the second multi-stage amplifier of the second power amplifier, for ramp-up and ramp-down in a TDMA system in transmission according to amplification of the first RF transmission input signal by the first power amplifier, the first bias circuit controls a level of a bias voltage supplied to an input electrode of an amplification element of the first multi-stage amplifier of the first power amplifier by using the first voltage follower in response to a level of a gain control signal, in transmission according to amplification of the third RF transmission input signal of the WCDMA system by the second power amplifier, the second voltage follower of the second bias circuit is controlled to be in an inactive state in response to the mode signal of the predetermined signal and the second bias circuit controls, in response to a level of the gain control signal, a level of a bias voltage supplied to an input electrode of an amplification element of the second multi-stage amplifier of the second power amplifier, and for ramp-up and ramp-down in transmission according to amplification of the second RF transmission input signal of the TDMA system by the second power amplifier, the second voltage follower of the second bias circuit is controlled to be in an inactive state in response to the mode signal of the different signal and the second bias circuit controls, in response to a level of the gain control signal, a level of a bias voltage supplied to the input electrode of the amplification element of the second multi-stage amplifier of the second power amplifier by using the second voltage follower controlled to be in the inactive state.

16. An RF power amplifier according to claim 14, wherein
the first power amplifier further includes a first input side bias circuit and a first input side voltage follower for the first input side amplifier of the first multi-stage amplifier,
the first input side bias circuit generates a first input side bias voltage that changes in response to a level of a gain control signal for ramp-up and ramp-down in the TDMA system in the GSM communication,
the first input side bias voltage generated by the first input side bias circuit is supplied to the input electrode of the first input side amplification element of the first input side amplifier of the first multi-stage amplifier of the first power amplifier via the first input side voltage follower,
the second power amplifier further includes a second input side bias circuit and a second input side voltage follower for the second input side amplifier of the second multi-stage amplifier,
the second input side bias circuit generates a second input side bias voltage that changes in response to a level of the gain control signal for ramp-up and ramp-down in the TDMA system in the GSM communication,
the second input side bias voltage generated by the second input side bias circuit is supplied to the input electrode of the second input side amplification element of the second input side amplifier of the second multi-stage amplifier of the second power amplifier via the second input side voltage follower, and
when the second power amplifier amplifies the third RF transmission input signal of the WCDMA system, the second input side voltage follower of the second power amplifier is controlled to be in an inactive state in response to the mode signal of the predetermined signal and the second input side bias voltage generated by the second input side bias circuit is supplied to the input electrode of the second input side amplification element bypassing the second input side voltage follower controlled to be in the inactive state.

17. An RF power amplifier according to claim 16, wherein
the first power amplifier further includes a first output side bias circuit and a first output side voltage follower for the first output side amplifier of the first multi-stage amplifier,
the first output side bias circuit generates a first output side bias voltage that changes in response to a level of the gain control signal for ramp-up and ramp-down in the TDMA system in the GSM communication,
the first output side bias voltage generated by the first output side bias circuit is supplied to the input electrode of the first output side amplification element of the first output side amplifier of the first multi-stage amplifier of the first power amplifier via the first output side voltage follower,
the second power amplifier further includes a second output side bias circuit and a second output side voltage follower for the second output side amplifier of the second multi-stage amplifier,
the second output side bias circuit generates a second output side bias voltage that changes in response to a level of the gain control signal for ramp-up and ramp-down in the TDMA system in the GSM communication,
the second output side bias voltage generated by the second output side bias circuit is supplied to the input electrode of the second output side amplification element of the second output side amplifier of the second multi-stage amplifier of the second power amplifier via the second output side voltage follower, and
when the second power amplifier amplifies the third RF transmission input signal of the WCDMA system, the second output side voltage follower of the second power amplifier is controlled to be in an inactive state in response to the mode signal of the predetermined signal and the second output side bias voltage generated by the second output side bias circuit is supplied to the input electrode of the second output side amplification element bypassing the second output side voltage follower controlled to be in the inactive state.

18. An RF power amplifier according to claim 14, wherein
a frequency of the second RF transmission input signal and the third RF transmission input signal is set to be about twice as high as a frequency of the first RF transmission input signal, and
the first power amplifier includes a harmonic trap circuit that bypasses the two-fold harmonic of the first RF transmission input signal to a ground potential point.

19. An RF power amplifier according to claim 14, wherein
the second input side amplifier of the second multi-stage amplifier of the second power amplifier is constituted by a negative feedback amplifier, and
a negative feedback amount of the second input side amplifier constituted by the negative feedback amplifier at the time when the mode signal is the predetermined signal is set to be larger than a negative feedback amount of the second input side amplifier constituted by the negative feedback amplifier at the time when the mode signal is the different signal.

20. An RF power amplifier according to claim 19, wherein
the second input side amplifier of the second multi-stage amplifier of the second power amplifier includes a negative feedback variable resistor connected between the output electrode and the input electrode of the second input side amplification element, when the mode signal is the predetermined signal, a resistance of the negative feedback variable resistor is controlled to be a low resistance, and when the mode signal is the different signal, the resistance of the negative feedback variable resistor is controlled to be a high resistance higher than the low resistance.

21. An RF power amplifier according to claim 14, wherein the second input side amplifier of the second multi-stage amplifier of the second power amplifier further includes a control amplification element connected between the output electrode of the second input side amplification element and a load element, a gain control voltage is applied to the input electrode of the control amplification element, when the second power amplifier amplifies the second RF transmission input signal of the TDMA system, the gain control voltage is set to a high level, and when the second power amplifier amplifies the third RF transmission input signal of the WCDMA system, the gain control voltage is set to a low level lower than the high level.

22. An RF power amplifier according to claim 14, wherein the first input side amplification element, the second input side amplification element, the first output side amplification element, and the second output side amplification element of the first power amplifier and the second power amplifier are field effect transistors.

23. An RF power amplifier according to claim 22, wherein the field effect transistors are lateral double diffused MOSs (LDMOSs).

24. An RF power amplifier according to claim 14, wherein the first input side amplification element, the second input side amplification element, the first output side amplification element, and the second output side amplification element of the first power amplifier and the second power amplifier are bipolar transistors.

25. An RF power amplifier according to claim 24, wherein the bipolar transistors are heterojunction bipolar transistors.

26. An RF power amplifier according to claim 14, wherein the first power amplifier, the second power amplifier, and a power detector that detects transmission power levels of the first power amplifier and the second power amplifier are mounted on a package of an RF power module.

\* \* \* \* \*